United States Patent
Bae et al.

(10) Patent No.: US 12,537,890 B2
(45) Date of Patent: Jan. 27, 2026

(54) FLEXIBLE CIRCUIT BOARD AND FOLDABLE ELECTRONIC DEVICE COMPRISING SAME

(71) Applicant: SAMSUNG ELECTRONICS CO., LTD., Suwon-si (KR)

(72) Inventors: Bumhee Bae, Suwon-si (KR); Kiman Kim, Suwon-si (KR); Junggil Kim, Suwon-si (KR); Younghun Seong, Suwon-si (KR); Jeongnam Cheon, Suwon-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 158 days.

(21) Appl. No.: 18/387,351

(22) Filed: Nov. 6, 2023

(65) Prior Publication Data
US 2024/0073307 A1   Feb. 29, 2024

Related U.S. Application Data

(63) Continuation of application No. PCT/KR2022/004975, filed on Apr. 6, 2022.

(30) Foreign Application Priority Data

May 7, 2021   (KR) .................. 10-2021-0059465

(51) Int. Cl.
H05K 1/00   (2006.01)
H04M 1/02   (2006.01)
(Continued)

(52) U.S. Cl.
CPC ....... *H04M 1/0277* (2013.01); *H04M 1/0216* (2013.01); *H04M 1/0274* (2013.01); *H05K 1/0253* (2013.01); *H05K 1/189* (2013.01)

(58) Field of Classification Search
CPC ............. H04M 1/0277; H04M 1/0216; H04M 1/0274; H04M 1/0268; H04M 1/0269;
(Continued)

(56) References Cited

U.S. PATENT DOCUMENTS 6,885,549 B2   4/2005   Thomason
8,093,502 B2   1/2012   Mikado et al.
(Continued)

FOREIGN PATENT DOCUMENTS

CN   102026480 A   4/2011
CN   102137543 A   7/2011
(Continued)

OTHER PUBLICATIONS

Flexible Printed Circuit Board.*
(Continued)

*Primary Examiner* — Rockshana D Chowdhury
(74) *Attorney, Agent, or Firm* — CANTOR COLBURN LLP

(57) ABSTRACT

A flexible circuit board and a foldable electronic device includes a first multi-layer region, a second multi-layer region and a highly bendable region disposed between the first multi-layer region and the second multi-layer region. The first multi-layer region and the second multi-layer region include a structure in which a plurality of copper clad laminates (CCLs) are stacked. The highly bendable region includes a structure in which a single CCL extending from one CCL among the plurality of CCLs in the first multi-layer region and the second multi-layer region is stacked. The single CCL may be configured such that a first ground wire, a second ground wire, and a plurality of sub wires disposed to be spaced apart between the first ground wire and the second ground wire transmit a single RF signal.

16 Claims, 17 Drawing Sheets

(51) Int. Cl.
*H05K 1/02* (2006.01)
*H05K 1/18* (2006.01)

(58) Field of Classification Search
CPC ........ H05K 1/0253; H05K 1/189; H05K 1/02; H05K 1/0218; H05K 1/025; H05K 1/028; H05K 1/14; H05K 1/147; H05K 1/148
See application file for complete search history.

(56) References Cited

U.S. PATENT DOCUMENTS

| | | | |
|---|---|---|---|
| 9,480,155 B2 | 10/2016 | Posner et al. | |
| 9,804,639 B2 | 10/2017 | Posner et al. | |
| 9,883,584 B2* | 1/2018 | Toyoshima | H05K 3/384 |
| 10,299,375 B2 | 5/2019 | Kim et al. | |
| 10,356,895 B2* | 7/2019 | Kim | H05K 1/0281 |
| 10,736,211 B2 | 8/2020 | Park et al. | |
| 11,012,546 B1* | 5/2021 | Song | G06F 1/1656 |
| 11,330,709 B2* | 5/2022 | Yu | H05K 1/032 |
| 11,410,791 B2 | 8/2022 | Bae et al. | |
| 11,758,650 B2* | 9/2023 | Byun | H05K 1/189 |
| | | | 174/254 |
| 11,765,818 B2* | 9/2023 | Shen | H05K 3/4635 |
| | | | 174/254 |
| 2011/0067904 A1* | 3/2011 | Aoyama | H05K 3/4069 |
| | | | 174/254 |
| 2011/0154658 A1* | 6/2011 | Chuang | H05K 3/427 |
| | | | 29/829 |
| 2011/0180307 A1 | 7/2011 | Naganuma et al. | |
| 2015/0189735 A1 | 7/2015 | Yu et al. | |
| 2018/0053981 A1 | 2/2018 | Bae et al. | |
| 2018/0113493 A1* | 4/2018 | Silvanto | E05D 11/0054 |
| 2020/0028949 A1 | 1/2020 | Kim et al. | |
| 2020/0060020 A1* | 2/2020 | Park | H05K 1/028 |
| 2020/0265971 A1 | 8/2020 | Bae et al. | |
| 2020/0359493 A1 | 11/2020 | Bae et al. | |
| 2020/0375026 A1 | 11/2020 | Shim et al. | |
| 2020/0389972 A1* | 12/2020 | Yu | H05K 1/0298 |
| 2021/0020329 A1 | 1/2021 | Bae et al. | |
| 2021/0305739 A1 | 9/2021 | Ghim et al. | |
| 2021/0360814 A1 | 11/2021 | Hong | |
| 2022/0344073 A1 | 10/2022 | Bae et al. | |
| 2023/0154645 A1 | 5/2023 | Bae et al. | |
| 2023/0171881 A1 | 6/2023 | Bae et al. | |
| 2023/0363082 A1* | 11/2023 | Kim | G06F 1/1616 |

FOREIGN PATENT DOCUMENTS

| | | | |
|---|---|---|---|
| JP | 2000077802 A | 3/2000 | |
| JP | 2006319197 A | 11/2006 | |
| JP | 2006352347 A | 12/2006 | |
| JP | 5782013 B2 | 9/2015 | |
| KR | 20120076968 A * | 7/2012 | ........... H05K 9/0081 |
| KR | 20170036339 A | 4/2017 | |
| KR | 20180019472 A | 2/2018 | |
| KR | 20200012679 A | 2/2020 | |
| KR | 20200021172 A | 2/2020 | |
| KR | 20200048238 A | 5/2020 | |
| KR | 102142521 B1 | 8/2020 | |
| KR | 20200101006 A | 8/2020 | |
| KR | 20200129341 A | 11/2020 | |
| KR | 20210009972 A | 1/2021 | |
| KR | 20210012364 A | 2/2021 | |
| KR | 20210016774 A | 2/2021 | |
| KR | 20210089342 A | 7/2021 | |
| KR | 20220014162 A | 2/2022 | |
| WO | 2020017836 A1 | 1/2020 | |
| WO | 2020171397 A1 | 8/2020 | |
| WO | 2020235787 A1 | 11/2020 | |
| WO | 2021010776 A1 | 1/2021 | |
| WO | 2021015479 A1 | 1/2021 | |

OTHER PUBLICATIONS

International Search Report and Written Opinion for International Application No. PCT/KR2022/004975; International Filing Date Apr. 6, 2021; Date of Mailing Jul. 15, 2022; 7 Pages.
Extended European Search Report Issued In EP Application No. 22799005.8-1218, Mail Date Sep. 6, 2024, 10 Pages.
Korean Office Action Issued In KR Application No. 10-2021-0059465; Mail Date Jul. 1, 2025; 15 Pages.

* cited by examiner

FLEXIBLE CIRCUIT BOARD AND FOLDABLE ELECTRONIC DEVICE COMPRISING SAME

This application is a continuation application, claiming priority under § 365(c), of International Application No. PCT/KR2022/004975, filed on Apr. 6, 2022, which is based on and claims the benefit of Korean patent application number 10-2021-0059465, filed on May 7, 2021, in the Korean Intellectual Property Office, the disclosures of which are incorporated by reference herein in their entireties.

TECHNICAL FIELD

Various embodiments of the disclosure relate to a flexible circuit board and a foldable electronic device including the same.

BACKGROUND ART

Electronic devices have been developed to be thin, lightweight, compact, and multifunctional, and electronic devices may include, to this end, various types of printed circuit boards on which various components are mounted (for example, a printed circuit board (PCB), a printed board assembly (PBA), a rigid-flexible PCB (RFPCB), a flexible printed circuit board (FPCB), and/or a flexible RF cable (FRC)).

DISCLOSURE OF INVENTION

Technical Problem

A foldable electronic device may have a flexible circuit board (for example, an FRC) disposed to be folded and unfolded in a folding area in which a display is folded. The flexible circuit board may be a flexible RF cable (FRC) including a wire for transmitting RF signals. The flexible circuit board is disposed across a folding area and thus is likely to be damaged by repeated folding and unfolding of the foldable electronic device.

Various embodiments may provide a flexible circuit board configured to provide a high degree of flexibility, thereby reducing the risk of damage despite repeated folding and unfolding, and an electronic device including the same.

Various embodiments may provide a flexible circuit board and an electronic device including the same, wherein interference in an electric field from a metal member of the electronic device is prevented, thereby preventing impedance mismatch of RF signals transmitted through the flexible circuit board.

Technical problems solved by the invention are not limited to the above-mentioned technical problems, and other technical problems not mentioned herein will be clearly understood from the following description by those skilled in the art to which the disclosure pertains.

Solution to Problem

An electronic device according to various embodiments may include a first housing, a second housing, a hinge module disposed between the first housing and the second housing such that the second housing can fold from one end of the first housing, and a flexible circuit board configured to electrically connect a first electric component disposed in a first space of the first housing and a second electric component disposed in a second space of the second housing. The flexible circuit board may include a first multilayer area disposed to be connected to a first connector disposed on one side end of the flexible circuit board, a second multilayer area disposed to be connected to a second connector disposed on the other side end of the flexible circuit board, and a highly-bendable characteristic area disposed between the first multilayer area and the second multilayer area. The first multilayer area and the second multilayer area may include a structure in which multiple copper clad laminates (CCLs) are laminated. The highly-bendable characteristic area may include a structure in which a single CCL extending from one of the multiple CCLs of the first multilayer area and the second multilayer area is laminated. The single CCL disposed in the highly-bendable characteristic area may be configured such that a first ground wire, a second ground wire, and multiple sub-wires disposed between the first ground wire and the second ground wire transfer one RF signal.

A flexible circuit board for transmitting an RF signal of an electronic device according to various embodiments may include a first multilayer area disposed to be connected to a first connector disposed on one side end of the flexible circuit board, a second multilayer area disposed to be connected to a second connector disposed on the other side end of the flexible circuit board, and a highly-bendable characteristic area disposed between the first multilayer area and the second multilayer area. The first multilayer area and the second multilayer area may include a structure in which multiple copper clad laminates (CCLs) are laminated. The highly-bendable characteristic area may include a structure in which a single CCL extending from one of the multiple CCLs of the first multilayer area and the second multilayer area is laminated. The single CCL disposed in the highly-bendable characteristic area may be configured such that a first ground wire, a second ground wire, and multiple sub-wires disposed between the first ground wire and the second ground wire transfer one RF signal.

Advantageous Effects of Invention

A flexible circuit board and an electronic device including the same, according to various embodiments, may provide a flexible circuit board having a high degree of flexibility, thereby reducing the risk of damage despite repeated folding and unfolding.

A flexible circuit board and an electronic device including the same, according to various embodiments, may prevent interference in an electric field from a metal member of the electronic device, thereby preventing impedance mismatch of RF signals transmitted through the flexible circuit board.

Various other advantageous effects identified explicitly or implicitly through the disclosure may be provided.

MODE FOR THE INVENTION

Figure 1:
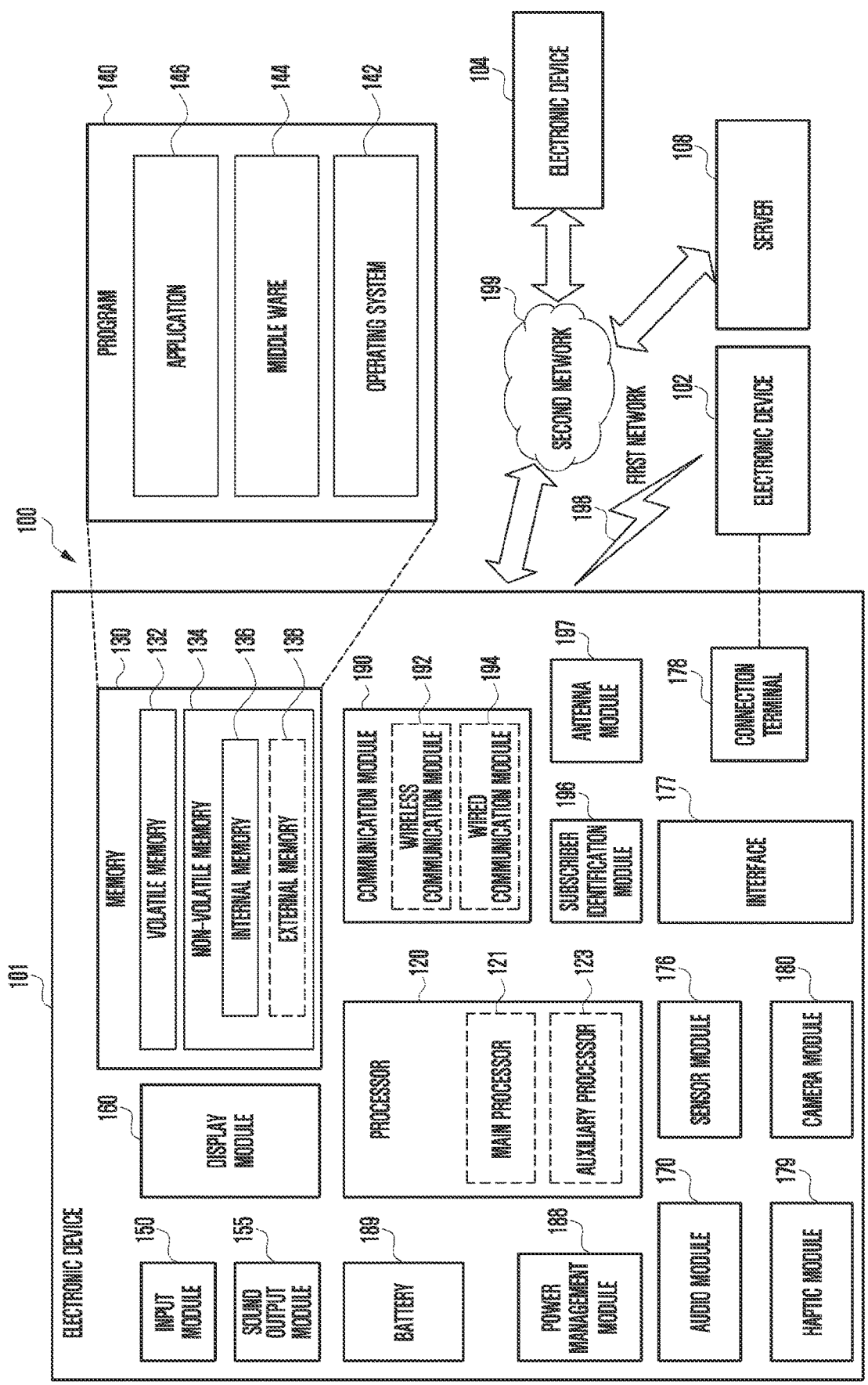
FIG. 1 is a block diagram of an electronic device inside a network environment according to various embodiments.

Hereinafter, various embodiments of the disclosure are described with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being related to another element such as being "on" another element, it can be directly on the other element or intervening elements may be present therebetween. In contrast, when an element is referred to as being related to another element such as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

FIG. 1 is a block diagram illustrating an electronic device 101 in a network environment 100 according to various embodiments. Referring to FIG. 1, the electronic device 101 in the network environment 100 may communicate with an electronic device 102 via a first network 198 (e.g., a short-range wireless communication network), or at least one of an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input 1module 150, a sound output 1module 155, a display 1module 160, an audio module 170, a sensor module 176, an interface 177, a connecting terminal 178, a haptic module 179, a camera module 180, a power management module 188, a battery 189, a communication module 190, a subscriber identification module (SIM) 196, or an antenna module 197. In some embodiments, at least one of the components (e.g., the 11connecting terminal 178) may be omitted from the electronic device 101, or one or more other components may be added in the electronic device 101. In some embodiments, some of the components (e.g., the sensor module 176, the camera module 180, or the antenna module 197) may be implemented as a single component (e.g., the display module 160).

The processor 120 may execute, for example, software (e.g., a program 140) to control at least one other component (e.g., a hardware or software component) of the electronic device 101 coupled with the processor 120, and may perform various data processing or computation. According to one embodiment, as at least part of the data processing or computation, the processor 120 may store a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), or an auxiliary processor 123 (e.g., a graphics processing unit (GPU), a neural processing unit (NPU), an image signal processor (ISP), a sensor hub processor, or a communication processor (CP)) that is operable independently from, or in conjunction with, the main processor 121. For example, when the electronic device 101 includes the main processor 121 and the auxiliary processor 123, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display 1module 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123. According to an embodiment, the auxiliary processor 123 (e.g., the neural processing unit) may include a hardware structure specified for artificial intelligence model processing. An artificial intelligence model may be generated by machine learning. Such learning may be performed, e.g., by the electronic device 101 where the artificial intelligence is performed or via a separate server (e.g., the server 108). Learning algorithms may include, but are not limited to, e.g., supervised learning, unsupervised learning, semi-supervised learning, or reinforcement learning. The artificial intelligence model may include a plurality of artificial neural network layers. The artificial neural network may be a deep neural network (DNN), a convolutional neural network (CNN), a recurrent neural network (RNN), a restricted boltzmann machine (RBM), a deep belief network (DBN), a bidirectional recurrent deep neural network (BRDNN), deep Q-network or a combination of two or more thereof but is not limited thereto. The artificial intelligence model may, additionally or alternatively, include a software structure other than the hardware structure.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input 1module 150 may receive a command or data to be used by another component (e.g., the processor 120) of the electronic device 101, from the outside (e.g., a user) of the electronic device 101. The input 1module 150 may include, for example, a microphone, a mouse, a keyboard, a key (e.g., a button), or a digital pen (e.g., a stylus pen).

The sound output 1module 155 may output sound signals to the outside of the electronic device 101. The sound output 1module 155 may include, for example, a speaker or a receiver. The speaker may be used for general purposes, such as playing multimedia or playing record. The receiver may be used for receiving incoming calls. According to an embodiment, the receiver may be implemented as separate from, or as part of the speaker.

The display 1module 160 may visually provide information to the outside (e.g., a user) of the electronic device 101. The display 1module 160 may include, for example, a display, a hologram device, or a projector and control circuitry to control a corresponding one of the display, hologram device, and projector. According to an embodiment, the display 1module 160 may include a touch sensor adapted to detect a touch, or a pressure sensor adapted to measure the intensity of force incurred by the touch.

The audio module 170 may convert a sound into an electrical signal and vice versa. According to an embodiment, the audio module 170 may obtain the sound via the input 1module 150, or output the sound via the sound output 1module 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to one embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a legacy cellular network, a 5G network, a next-generation communication network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The wireless communication module 192 may support a 5G network, after a 4G network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 192 may support a high-frequency band (e.g., the mmWave band) to achieve, e.g., a high data transmission rate. The wireless communication module 192 may support various technologies for securing performance on a high-frequency band, such as, e.g., beamforming, massive multiple-input and multiple-output (massive MIMO), full dimensional MIMO (FD-MIMO), array antenna, analog beam-forming, or large scale antenna. The wireless communication module 192 may support various requirements specified in the electronic device 101, an external electronic device (e.g., the electronic device 104), or a network system (e.g., the second network 199). According to an embodiment, the wireless communication module 192 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of 1 ms or less) for implementing URLLC.

The antenna module 197 may transmit or receive a signal or power to or from the outside (e.g., the external electronic device) of the electronic device 101. According to an embodiment, the antenna module 197 may include an antenna including a radiating element composed of a conductive material or a conductive pattern formed in or on a substrate (e.g., a printed circuit board (PCB)). According to an embodiment, the antenna module 197 may include a plurality of antennas (e.g., array antennas). In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. According to an embodiment, another component (e.g., a radio frequency integrated circuit (RFIC)) other than the radiating element may be additionally formed as part of the antenna module 197.

According to various embodiments, the antenna module 197 may form a mmWave antenna module. According to an embodiment, the mmWave antenna module may include a printed circuit board, a RFIC disposed on a first surface (e.g., the bottom surface) of the printed circuit board, or adjacent to the first surface and capable of supporting a designated high-frequency band (e.g., the mmWave band), and a plurality of antennas (e.g., array antennas) disposed on a second surface (e.g., the top or a side surface) of the printed circuit board, or adjacent to the second surface and capable of transmitting or receiving signals of the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 or 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, mobile edge computing (MEC), or client-server computing technology may be used, for example. The electronic device 101 may provide ultra low-latency services using, e.g., distributed computing or mobile edge computing. In another embodiment, the external electronic device 104 may include an internet-of-things (IoT) device. The server 108 may be an intelligent server using machine learning and/or a neural network. According to an embodiment, the external electronic device 104 or the server 108 may be included in the second network 199. The electronic device 101 may be applied to intelligent services (e.g., smart home, smart city, smart car, or healthcare) based on 5G communication technology or IoT-related technology.

The electronic device according to various embodiments may be one of various types of electronic devices. The electronic devices may include, for example, a portable communication device (e.g., a smartphone), a computer device, a portable multimedia device, a portable medical device, a camera, a wearable device, or a home appliance. According to an embodiment of the disclosure, the electronic devices are not limited to those described above.

It should be appreciated that various embodiments of the present disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

As used in connection with various embodiments of the disclosure, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities, and some of the multiple entities may be separately disposed in different components. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

Figure 2:
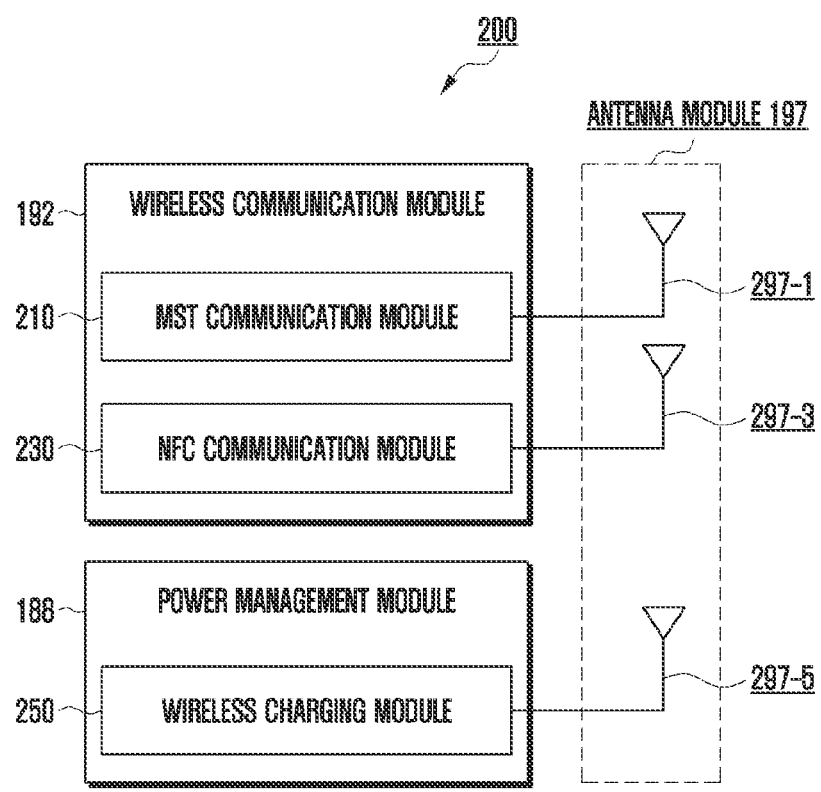
FIG. 2 is a block diagram of a wireless communication module, a power management module, and an antenna module of an electronic device according to various embodiments.

FIG. 2 is a block diagram 200 regarding a wireless communication module 192, a power management module 188, and an antenna module 197 of an electronic device 101 according to various embodiments. Referring to FIG. 2, the wireless communication module 192 may include an MST communication module 210 or an NFC communication module 230, and the power management module 188 may include a wireless charging module 250. In this case, the antenna module 297 may include multiple antennas including an MST antenna 297-1 connected to the MST communication module 210, an NFC antenna 297-3 connected to the NFC communication module 230, and a wireless charging antenna 297-5 connected to the wireless charging module 250. For convenience of description, descriptions of components described above with reference to FIG. 1 will be omitted or simplified herein.

The MST communication module 210 may receive a signal including payment information, such as control information or card information, from a processor 120, generate a magnetic signal corresponding to the received signal through the MST antenna 297-1, and then transfer the generated magnetic signal to an external electronic device (for example, a POS device). In order to generate the magnetic signal, according to an embodiment, the MST communication module 210 may include a switching module (not illustrated) including one or more switches connected to the MST antenna 297-1, and the switching module may be controlled to change the direction of a voltage or a current supplied to the MST antenna 297-1 according to the received signal. The change in direction of the voltage or current ensures that the direction of a magnetic signal (for example, a magnetic field) emitted through the MST antenna 297-1 can be changed accordingly. A magnetic signal in a direction-changed state, if sensed by an external electronic device 102, may cause an effect (for example, a waveform) similar to a magnetic field occurring when a magnetic card corresponding to the received signal (for example, card information) is swiped through a card reader of the electronic device 102. According to an embodiment, payment-related information and control signals received by the electronic device 102 as the magnetic signals may be transmitted to an external server 108 (for example, a payment server) through a network 199, for example.

The NFC communication module 230 may acquire a signal including payment information, such as control information or card information, from the processor 120 and may transmit the acquired signal to an external electronic device 102 through the NFC antenna 297-3. According to an embodiment, the NFC communication module 230 may receive a signal emitted from the external electronic device 102 through the NFC antenna 297-3.

The wireless charging module 250 may wirelessly transmit power to an external electronic device 102 (for example, a mobile phone or a wearable device) through the wireless charging antenna 297-5 or wirelessly receive power from an external electronic device 102 (for example, a wireless charging device). The wireless charging module 250 may support at least one of various wireless charging schemes including a magnetic resonance scheme or a magnetic induction scheme.

According to an embodiment, some antennas among the MST antenna 297-1, the NFC antenna 297-3, or the wireless charging antenna 297-5 may share at least a part of a radiator with each other. For example, the radiator of the MST antenna 297-1 may be used as the radiator of the NFC antenna 297-3 or the wireless charging antenna 297-5, and vice versa. In this case, the antenna module 297 may include a switching circuit (not illustrated) configured to selectively connect (for example, close) or disconnect (for example, open) at least some of the antennas 297-1, 297-3, or 297-5 under the control of the wireless communication module 192 (for example, the MST communication module 210 or the NFC communication module 230) or the power management module 188 (for example, the wireless charging module 250). For example, if the electronic device 101 uses a wireless charging function, the NFC communication module 230 or the wireless charging module 250 may control the switching circuit so as to disconnect at least a partial area of a radiator shared by the NFC antenna 297-3 and the wireless charging antenna 297-5 from the NFC antenna 297-5 temporarily and may connect the same to the wireless charging antenna 297-5.

According to an embodiment, functions of at least one of the MST communication module 210, the NFC communication module 230, or the wireless charging module 250 may be controlled by an external processor (for example, the processor 120). According to an embodiment, designated functions (for example, payment functions) of the MST communication module 210 or the NFC communication module 230 may be performed in a trusted execution environment (TEE). According to various embodiments, the TEE may form, for example, an execution environment in which at least a partial designated area of the memory 130 is allocated to be used for a function requiring a high level of security (for example, a financial transaction or personal information-related function). In this case, access to the designated area may be limitedly allowed differently according to the accessing entity or the application executed in the TEE.

Figure 3A:
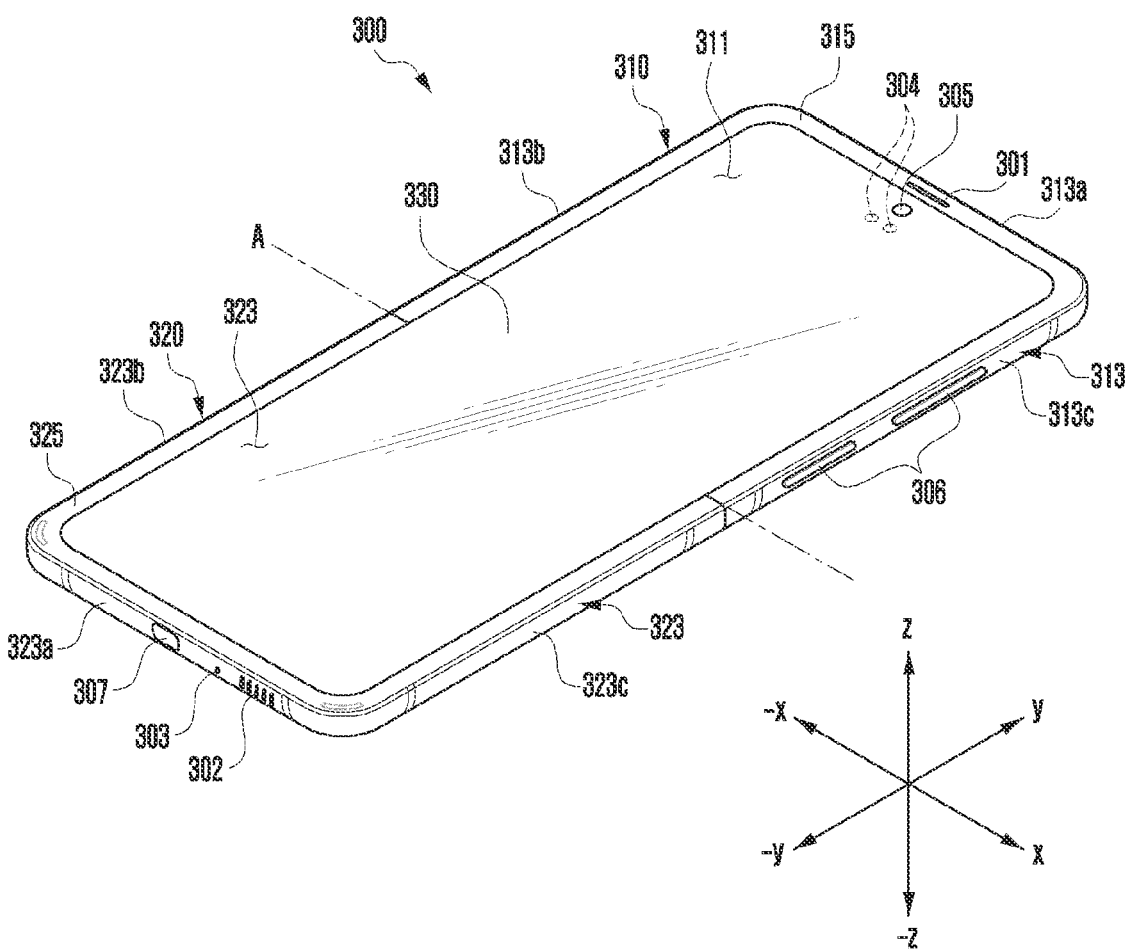
FIG. 3A is a perspective view of an electronic device in a flat stage or unfolding state, according to various embodiments.
Figure 3B:
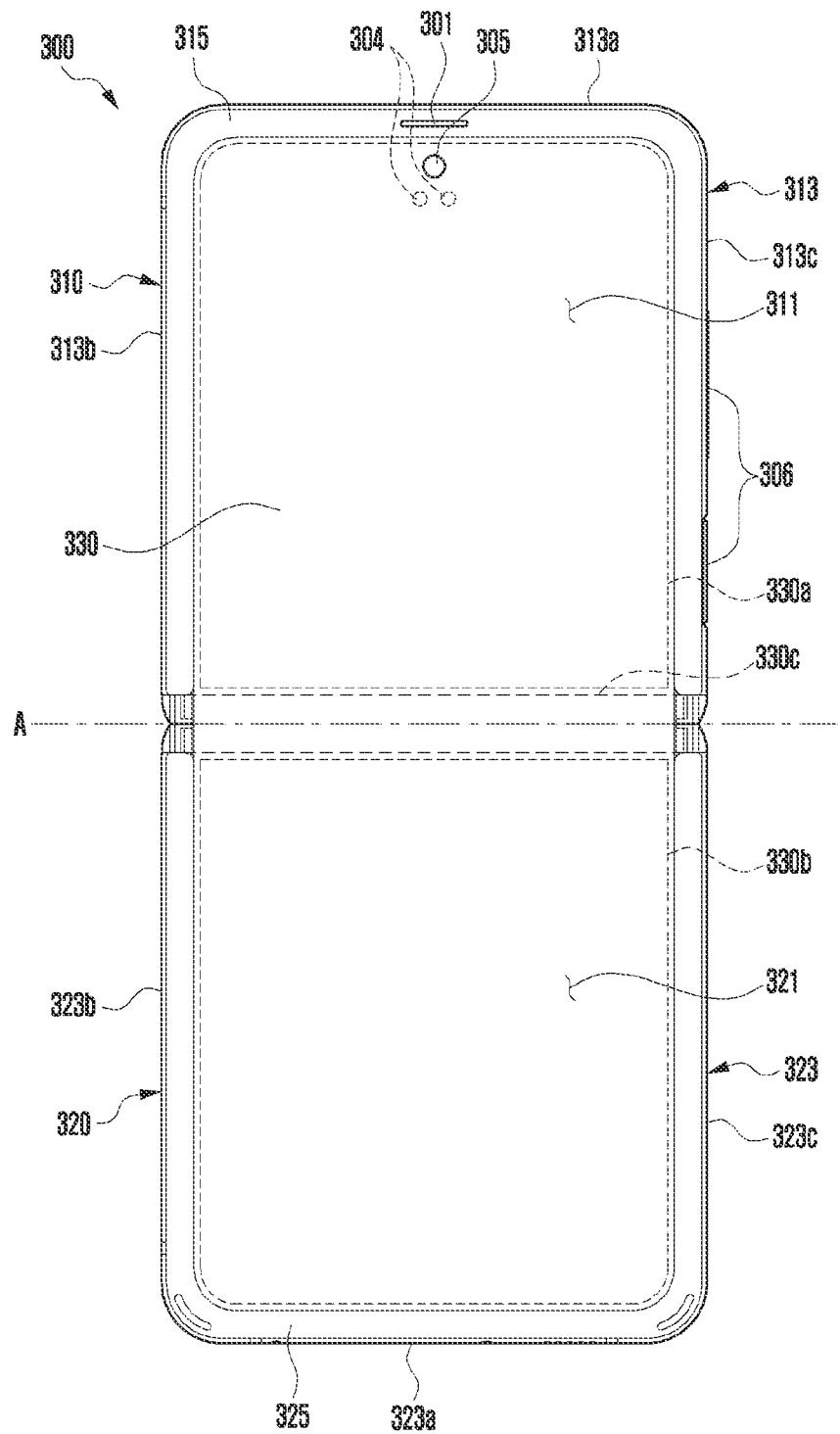
FIG. 3B is a front planar view of an electronic device in an unfolding state, according to various embodiments.
Figure 3C:
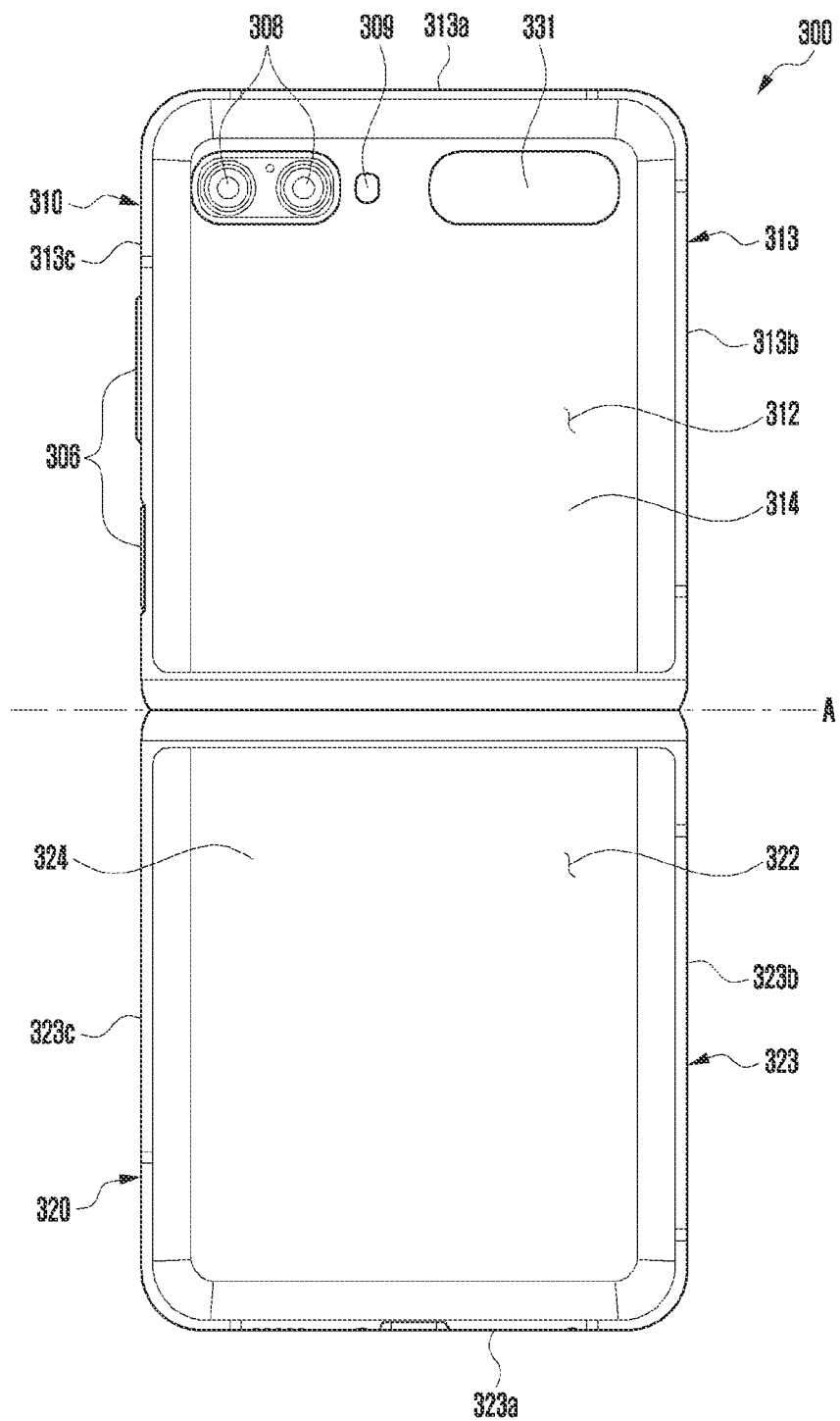
FIG. 3C is a rear planar view of an electronic device in an unfolding state, according to various embodiments.

FIG. 3A is a perspective view of an electronic device in a flat stage or unfolding state according to various embodiments. FIG. 3B is a front planar view of an electronic device in an unfolding state according to various embodiments. FIG. 3C is a rear planar view of an electronic device in an unfolding state according to various embodiments.

Figure 4A:
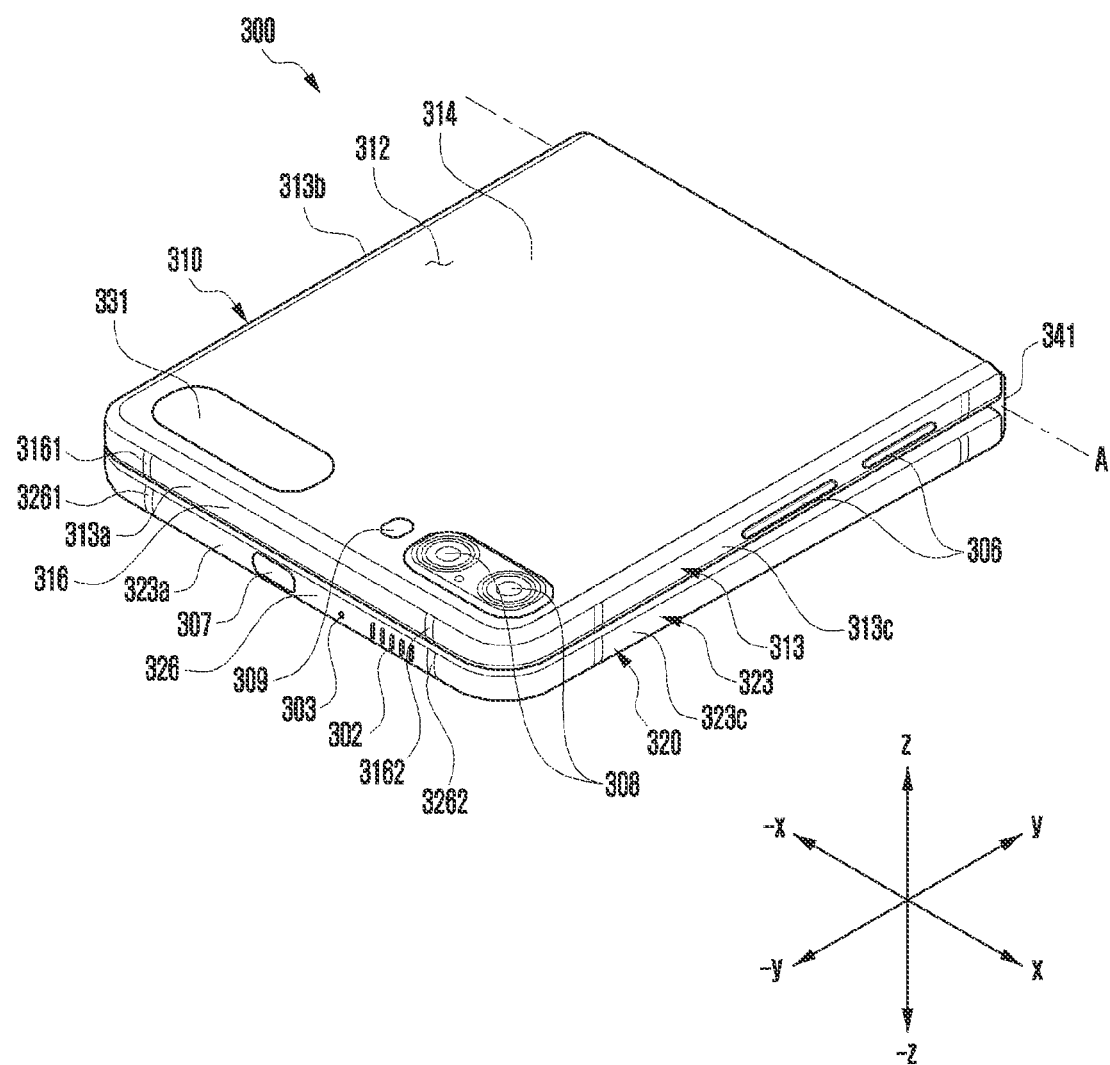
FIG. 4A is a perspective view of an electronic device in a folding state, according to various embodiments.
Figure 4B:
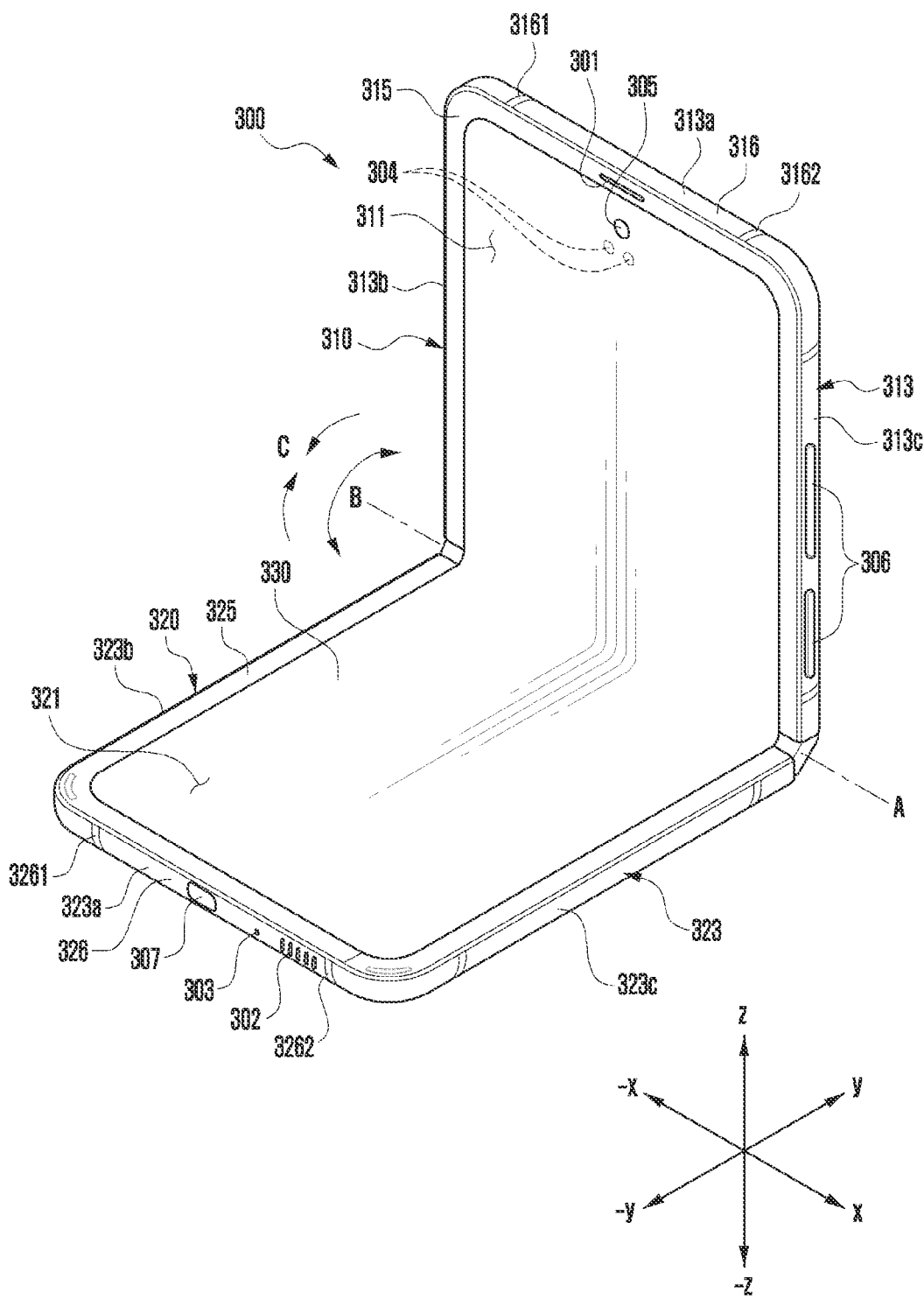
FIG. 4B is a perspective view of an electronic device in an intermediate state, according to various embodiments.

FIG. 4A is a perspective view of an electronic device in a folding state according to various embodiments. FIG. 4B is a perspective view of an electronic device in an intermediate state according to various embodiments.

Figure 5:
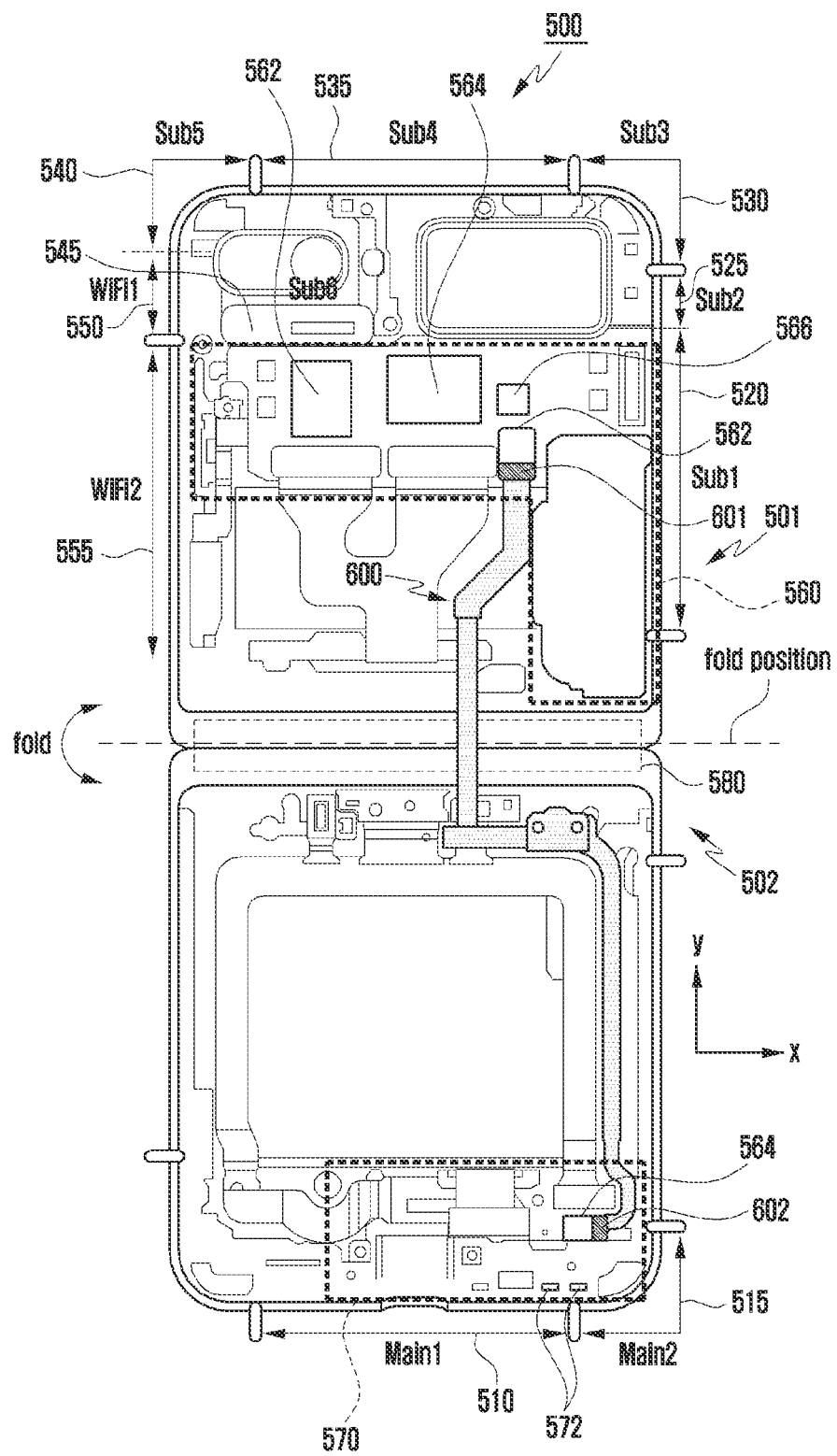
FIG. 5 illustrates an electronic device, according to various embodiments, from which rear covers are removed.

According to an embodiment and referring to FIG. 3A to FIG. 4B, the electronic device 300 may include a first housing 310 and a second housing 320 (for example, foldable housings) rotatably coupled so as to be folded while facing each other with reference to a hinge module (for example, the hinge module 580 in FIG. 5). In some embodiments, the hinge module 580 may be disposed in the X axis direction or Y axis direction. In some embodiments, two or more hinge modules 580 may be disposed so as to be folded in a substantially identical direction or in different directions.

According to an embodiment, the electronic device 300 may include a first display 330 (for example, a foldable display or a flexible display) disposed in an area formed by the first housing 310 and the second housing 320. According to an embodiment, the first housing 310 and the second housing 320 may be disposed on both sides of a folding axis (axis A) and may have substantially symmetric shapes with regard to the folding axis (axis A).

According to an embodiment, the angle or distance between the first housing 310 and the second housing 320 may differ depending on whether the electronic device 300 is in a flat stage or unfolding state, in a folding state, or in an intermediate state.

According to various embodiments, the first housing 310 (for example, a first housing structure) may be coupled to one end of the hinge module 580, and the second housing 320 (for example, a second housing structure) may be coupled to the other end of the hinge module 580.

According to an embodiment, the first housing 310 may include a first surface 311 configured to face in a first direction (for example, forward direction) (z axis direction)

in an unfolding state, and a second surface 312 configured to face in a second direction (for example, rearward direction) (−z axis direction) opposite to the first surface 311.

According to an embodiment, the second housing 320 may include a third surface 321 configured to face in the first direction (z axis direction) in an unfolding state, and a fourth surface 322 configured to face in the second direction (−z axis direction).

According to an embodiment, the electronic device 300 may operate such that, in an unfolding state, the first surface 311 of the first housing 310 and the third surface 321 of the second housing 320 face in substantially the same first direction (z axis direction) and, in a folding state, the first surface 311 and the third surface 321 face each other.

According to an embodiment, the electronic device 300 may operate such that, in an unfolding state, the second surface 312 of the first housing 310 and the fourth surface 322 of the second housing 320 face in substantially the same second direction (−z axis direction) and, in a folding state, the second surface 312 and the fourth surface 322 face in opposite directions. For example, in a folding state, the second surface 312 may face in the first direction (z axis direction), and the fourth surface 322 may face in the second direction (−z axis direction).

According to various embodiments, the first housing 310 may include a first lateral frame 313 configured to form the exterior of the electronic device 300 at least partially, and a first rear cover 314 coupled to the first lateral frame 313 and configured to form at least a part of the second surface 312 of the electronic device 300.

According to an embodiment, the first lateral frame 313 may include a first lateral surface 313a, a second lateral surface 313b extending from one end of the first lateral surface 313a, and a third lateral surface 313c extending from the other end of the first lateral surface 313a. According to an embodiment, the first lateral frame 313 may be formed in a rectangular (for example, square or rectangular) shape through the first lateral surface 313a, the second lateral surface 313b, and the third lateral surface 313c.

According to various embodiments, the second housing 320 may include a second lateral frame 323 configured to form the exterior of the electronic device 300 at least partially, and a second rear cover 324 coupled to the second lateral frame 323 and configured to form at least a part of the fourth surface 322 of the electronic device 300.

According to an embodiment, the second lateral frame 323 may include a fourth lateral surface 323a, a fifth lateral surface 323b extending from one end of the fourth lateral surface 323a, and a sixth lateral surface 323c extending from the other end of the fourth lateral surface 323a. According to an embodiment, the second lateral frame 323 may be formed in a rectangular shape through the fourth lateral surface 323a, the fifth lateral surface 323b, and the sixth lateral surface 323c.

According to various embodiments, the first housing 310 and the second housing 320 is not limited to the illustrated type and coupling and may be implemented by a combination and/or coupling of other shapes and/or components. For example, in some embodiments, the first lateral frame 313 may be formed integrally with the first rear cover 314, and the second lateral frame 323 may be formed integrally with the second rear cover 324.

According to various embodiments, in an unfolding state of the electronic device 300, the second lateral surface 313b of the first lateral frame 313 and the fifth lateral surface 323b of the second lateral frame 323 may be connected with no gap.

According to an embodiment, in an unfolding state of the electronic device 300, the third lateral surface 313c of the first lateral frame 313 and the sixth lateral surface 323c of the second lateral frame 323 may be connected with no gap.

According to an embodiment, the electronic device 300 may be configured such that, in an unfolding state, the combined length of the second lateral surface 313b and the fifth lateral surface 323b is larger than the length of the first lateral surface 313a and/or the fourth lateral surface 323a. According to an embodiment, the electronic device 300 may be configured such that the combined length of the third lateral surface 313c and the sixth lateral surface 323c is larger than the length of the first lateral surface 313a and/or the fourth lateral surface 323a.

According to various embodiments, the first lateral frame 313 and/or the second lateral frame 323 may be made of a metal, or further include a polymer injected into the metal. According to an embodiment, the first lateral frame 313 and/or the second lateral frame 323 may include at least one conductive part 316 and/or 326 electrically segmented through at least one segmentation portion 3161, 3162, and/or 3261, 3262 which may be made of a polymer. According to an embodiment, the at least one conductive part may be electrically connected to a wireless communication circuit included in the electronic device 300 and thus may be used as an antenna operating in at least one designated band (for example, legacy band).

According to various embodiments, the first rear cover 314 and/or the second cover 324 may be formed by, for example, at least one or a combination of at least two of coated or colored glass, ceramic, polymer, or metal (for example, aluminum, stainless steel (STS), or magnesium).

According to various embodiments, the first display 330 may be disposed so as to extend from the first surface 311 of the first housing 310 to at least a part of the third surface 321 of the second housing 320 across the hinge module 580. For example, the first display 330 may include a first planar portion 330a substantially corresponding to the first surface 311, a second planar portion 330b corresponding to the second surface 321, and a bendable portion 330c configured to connect the first planar portion 330a and the second planar portion 330b and correspond to the hinge module 580.

According to an embodiment, the electronic device 300 may include a first protective cover 315 (for example, a first protective frame or a first decorative member) coupled along the edge of the first housing 310.

According to an embodiment, the electronic device 300 may include a second protective cover 325 (for example, a second protective frame or a second decorative member) coupled along the edge of the second housing 320.

According to an embodiment, the first protective cover 315 and/or the second protective cover 325 may be made of a metal and/or polymer material. According to an embodiment, the first protective cover 315 and/or the second protective cover 325 may be used as a decoration member.

According to an embodiment, the first display 330 may be positioned such that the edge of the first planar portion 330a is interposed between the first housing 310 and the first protective cover 315. According to an embodiment, the first display 330 may be positioned such that the edge of the second planar portion 330b is interposed between the second housing 320 and the second protective cover 325.

According to an embodiment, the electronic device 300 may include a hinge housing 341 (for example, a hinge cover). According to an embodiment, the hinge housing 341 may support the hinge module 580.

According to various embodiments, the electronic device 300 may include a second display 331 disposed separately from the first display 330. According to an embodiment, the second display 331 may be disposed on the second surface 312 of the first housing 310 so as to be at least partially exposed. According to an embodiment, the second display 331 may display state information of the electronic device 300 so as to replace the display function of the first display 330 when the electronic device 300 is in a folding state.

According to an embodiment, the second display 331 may be disposed to be seen from the outside through at least a partial area of the first rear cover 314. In some embodiments, the second display 331 may be disposed on the fourth surface 324 of the second housing 320. In this case, the second display 331 may be disposed to be seen from the outside through at least a partial area of the second rear cover 324.

According to various embodiments, the electronic device 300 may include at least one of an input device 303 (for example, a microphone), sound output devices 301 and 302, a sensor module 304, camera devices 305 and 308, a key input device 306, and/or a connector port 307. In the illustrated embodiment, the input device 303 (for example, a microphone), the sound output devices 301 and 302, the sensor module 304, the camera devices 305 and 308, the key input device 306, and/or the connector port 307 refers to a hole or a shape formed in the first housing 310 and/or the second housing 320, but the above-mentioned components (for example, the input device 303 (for example, a microphone), the sound output devices 301 and 302, the sensor module 304, the camera devices 305 and 308, the key input device 306, and/or the connector port 307) may be defined to include a substantial electronic component (for example, an input device, a sound output device, a sensor module, and/or a camera device) disposed inside the electronic device 300 and configured to operate through a hole or a shape.

According to various embodiments, the input device 303 may include at least one microphone 303 disposed on the second housing 320. In some embodiments, the input device 303 may include multiple microphones 303 disposed such that the direction of a sound can be sensed. In some embodiments, the multiple microphones 303 may be disposed on a part of the first housing 310 and/or on a part of the second housing 320.

According to an embodiment, the sound output devices 301 and 302 may include speakers 301 and 302. According to an embodiment, the speakers 301 and 302 may include a speech receiver 301 disposed on the first housing 301 and a speaker 302 disposed in the second housing 320. In some embodiments, the input device 303, the sound output devices 301 and 302, and the connector 307 may be disposed in a space provided by the first housing 310 and/or the second housing 320 of the electronic device 300, and may be exposed to external environments through at least one hole formed in the first housing 310 and/or the second housing 320.

According to an embodiment, the at least one connector port 307 may be used to transmit/receive power and/or data with an external electronic device. In some embodiments, the at least one connector port (for example, an ear jack hole) may contain a connector (for example, an ear jack) for transmitting/receiving audio signals with an external electronic device. In some embodiments, the hole formed in the first housing 310 and/or the second housing 320 may be used for both the input device 303 and the sound output devices 301 and 302. In some embodiments, the sound output devices 301 and 302 may further include a piezoelectric speaker.

According to various embodiments, the sensor module 304 may generate an electric signal or a data value corresponding to the internal operating state of the electronic device 300 or external environmental state.

According to an embodiment, the sensor module 304 may detect external environments through the first surface 311 of the first housing 310. In some embodiments, the electronic device 300 may further include at least one sensor module disposed to detect external environments through the second surface 312 of the first housing 310.

According to an embodiment, the sensor module 304 (for example, an illuminance sensor) may be disposed under the first display 330 (for example, in a second direction (−z axis direction) from the first display 330) so as to detect external environments through the first display 330.

According to an embodiment, the sensor module 304 may include at least one of a gesture sensor, a gyro sensor, an atmospheric pressure sensor, a magnetic sensor, an acceleration sensor, a grip sensor, a color sensor, an infrared (IR) sensor, a biometric sensor, a temperature sensor, a humidity sensor, an illuminance sensor, a proximity sensor, a biometric sensor, an ultrasonic sensor, or an illuminance sensor 304.

According to various embodiments, the camera devices 305 and 308 may include a first camera device 305 (for example, a front camera device) disposed on the first surface 311 of the first housing 310 and a second camera device 308 disposed on the second surface 312 of the first housing 310.

According to an embodiment, the electronic device 300 may further include a flash 309 disposed near the second camera device 308. According to an embodiment, the camera devices 305 and 308 may include one lens or multiple lenses, an image sensor, and/or an image signal processor.

According to an embodiment, the flash 309 may include a light-emitting diode and/or a xenon lamp.

According to an embodiment, the camera devices 305 and 308 may be disposed such that two or more lenses (for example, a wide-angle lens, an ultra-wide-angle lens, or a telephoto lens) and image sensors are positioned on one surface (for example, the first surface 311, the second surface 312, the third surface 321, or the fourth surface 322) of the electronic device 300. In some embodiments, the camera devices 305 and 308 may include a time-of-flight (TOF) sensor, a light detection and ranging (LiDAR) sensor and/or an image sensor.

According to various embodiments, the key input device 306 (for example, a key button) may be disposed on the third lateral surface 313c of the first lateral frame 313 of the first housing 310. In some embodiments, the key input device 306 may be disposed on at least one lateral surface among other lateral surfaces 313a and 313b of the first housing 310 and/or lateral surfaces 323a, 323b, and 323c of the second housing 320. In some embodiments, the electronic device 300 may not include some or all of the key input devices 306, and a key input device 306 not included therein may be implemented in a different type (for example, a soft key) on the first display 330. In some embodiments, the key input device 306 may be implemented by using a pressure sensor included in the first display 330.

According to various embodiments, some camera device 305 among the camera devices 305 and 308 and/or sensor module 304 may be disposed to be exposed through the first display 330. For example, the first camera device 305 and/or the sensor module 304 may be disposed in the inner space of the electronic device 300 so as to contact external environments through an opening (for example, a through-hole) formed at least partially in the first display 330. In another embodiment, some camera device 305 among the camera devices 305 and 308 or the sensor module 304 may be disposed in the inner space of the electronic device 300 to perform a function thereof without being visually exposed through the first display 330. For example, in this case, the first display 330 may have no opening formed in an area facing some camera device 305 and/or the sensor module 304.

Referring to FIG. 4B, the electronic device 300 according to an embodiment may operate so as to maintain an intermediate state through the hinge module 580. In this case, the electronic device 300 may control the first display 330 so as to display different contents in a display area corresponding to the first surface 311 and in another display area corresponding to the third surface 321.

According to an embodiment, the electronic device 300 may operate in a substantially unfolding state (for example, the unfolding state in FIG. 3A) and/or in a substantially folding state (for example, the folding state in FIG. 4A) with reference to a predetermined inflection angle (for example, the angle between the first housing 310 and the second housing 320 in an intermediate state) through the hinge module 580. For example, the electronic device 300 may operate so as to transition to an unfolding state (for example, the unfolding state in FIG. 3A) if a pressurizing force is applied thereto in an unfolding direction (direction B) when the electronic device 300 has been unfolded to the predetermined inflection angle, through the hinge module 580. For example, the electronic device 300 may operate so as to transition to a folding state (for example, the folding state in FIG. 4A) if a pressurizing force is applied thereto in a folding direction (direction C) when the electronic device 300 has been unfolded to the predetermined inflection angle, through the hinge module 580. In an embodiment, the electronic device 300 may operate so as to maintain an unfolding state (not illustrated) at various angles through the hinge module 580.

An electronic device according to various embodiments (for example, the electronic device 101 in FIG. 1) may include a first housing, a second housing, a hinge module disposed between the first housing and the second housing such that the second housing can fold from one end of the first housing, and a flexible circuit board (for example, the flexible circuit board 600 in FIG. 5) configured to electrically connect a first electric component disposed in a first space of the first housing and a second electric component disposed in a second space of the second housing. The flexible circuit board 600 may include a first multilayer area (for example, the first multilayer area 621 in FIG. 7) disposed to be connected to a first connector disposed on one side end of the flexible circuit board 600, a second multilayer area (for example, the second multilayer area 622 in FIG. 7) disposed to be connected to a second connector disposed on the other side end of the flexible circuit board 600, and a highly-bendable characteristic area (for example, the first part 610 in FIG. 6) disposed between the first multilayer area 621 and the second multilayer area 622. The first multilayer area 621 and the second multilayer area 622 may include a structure in which multiple copper clad laminates (CCLs) are laminated. The highly-bendable characteristic area 610 may include a structure in which a single CCL extending from one of the multiple CCLs of the first multilayer area 621 and the second multilayer area 622 is laminated. The single CCL disposed in the highly-bendable characteristic area 610 may be configured such that a first ground wire, a second ground wire, and multiple sub-wires 911 (See FIG. 9) disposed between the first ground wire and the second ground wire transfer one RF signal.

According to an embodiment, the lamination structure of the first multilayer area 621 may include a first CCL extending from the single CCL disposed in the highly-bendable characteristic area 610, a second CCL formed in a first direction from the first CCL, and a third CCL formed in a second direction from the first CCL.

According to an embodiment, at least one of the first CCL, the second CCL, and the third CCL may be formed as a single-surface CCL.

According to an embodiment, the first CCL may be formed as a single-surface CCL.

Figure 9:
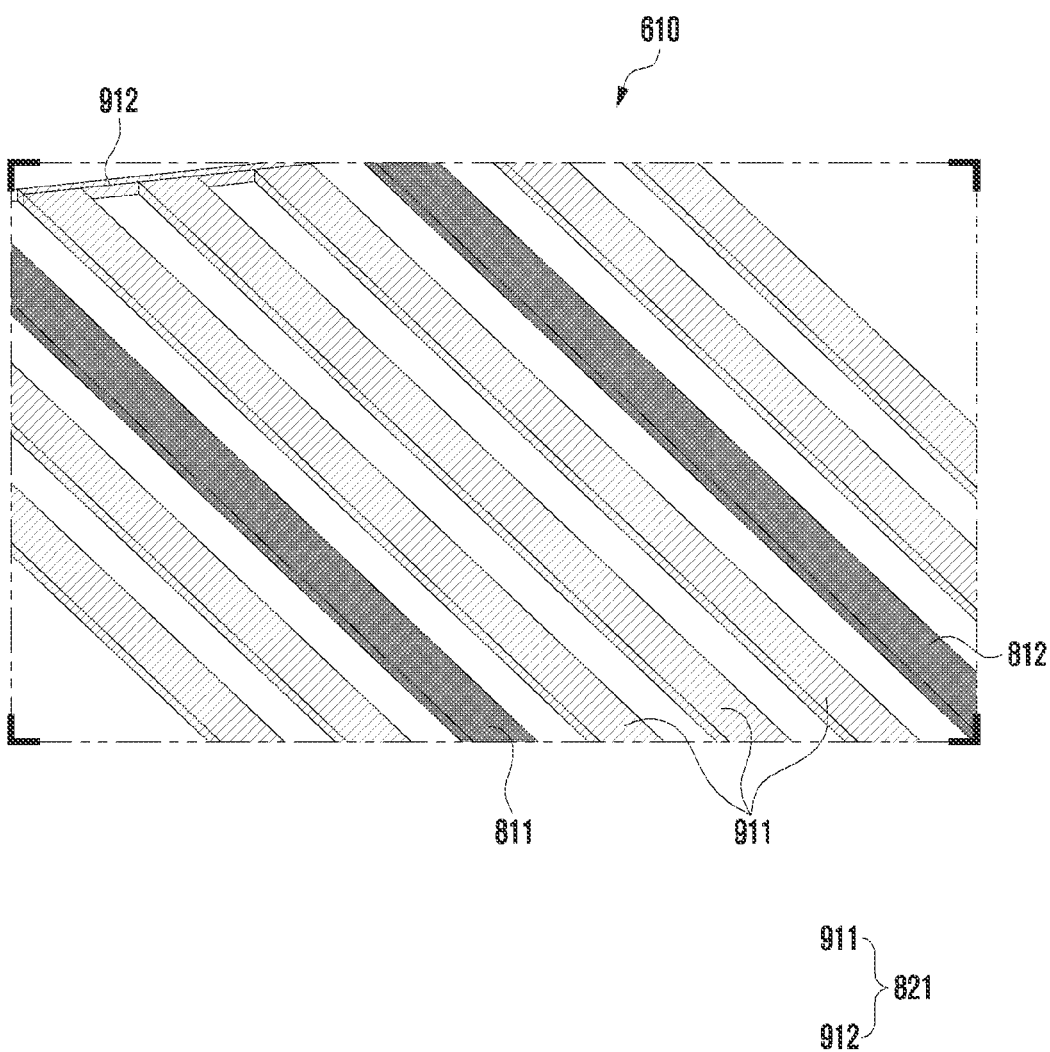
FIG. 9 is a perspective view of the first part of the flexible circuit board illustrated in FIG. 8, as seen from above, according to various embodiments.

According to an embodiment, referring to FIG. 9, the multiple sub-wires 911 may include three sub-wires 911, and one of the three sub-wires 911 may have an impedance determined by the following equation:

$$1/Z_{Total} = 1/Z_{1\text{-}1} + 1/Z_{1\text{-}2} + 1/Z_{1\text{-}3}$$

According to an embodiment, the electronic device may further include a third multilayer area disposed between the first multilayer area 621 and the second multilayer area 622. The third multilayer area may have a lamination structure identical to the lamination structure of the first multilayer area 621 and the second multilayer area 622.

According to an embodiment, the electronic device may further include a sub-ground wire disposed between the multiple sub-wires 911.

According to an embodiment, the electronic device may further include multiple ground vias disposed at an interval between the multiple sub-wires 911.

A flexible circuit board 600 for transmitting an RF signal of an electronic device 101 according to various embodiments may include a first multilayer area 621 disposed to be connected to a first connector disposed on one side end of the flexible circuit board 600, a second multilayer area 622 disposed to be connected to a second connector disposed on the other side end of the flexible circuit board 600, and a highly-bendable characteristic area 610 disposed between the first multilayer area 621 and the second multilayer area 622. The first multilayer area 621 and the second multilayer area 622 may include a structure in which multiple copper clad laminates (CCLs) are laminated. The highly-bendable characteristic area 610 may include a structure in which a single CCL extending from one of the multiple CCLs of the first multilayer area 621 and the second multilayer area 622 is laminated. The single CCL disposed in the highly-bendable characteristic area 610 may be configured such that a first ground wire, a second ground wire, and multiple sub-wires 911 disposed between the first ground wire and the second ground wire transfer one RF signal.

According to an embodiment, the electronic device may further include a third multilayer area disposed between the first multilayer area 621 and the second multilayer area 622. The third multilayer area may have a lamination structure identical to the lamination structure of the first multilayer area 621 and the second multilayer area 622.

FIG. 5 illustrates an electronic device 500, according to various embodiments, from which rear covers are removed.

The electronic device illustrated in FIG. 5 may include an embodiment at least partially similar to or different from the electronic device 101 illustrated in FIG. 1 and/or the electronic device 300 illustrated in FIG. 3A to FIG. 4B.

Referring to FIG. 5, the electronic device 500 according to various embodiments (for example, the electronic device 101 illustrated in FIG. 1 and/or the electronic device 300 illustrated in FIG. 3A to FIG. 4B) may be a foldable device. The electronic device 500 may include a hinge module 580 disposed in a fold position (for example, a folding area). For example, the electronic device 500 may be folded or unfolded in the y axis direction with reference to the fold position by using the hinge module 580. With reference to the fold position when the electronic device 500 is folded, a first part 501 disposed to correspond to the first housing (for example, the first housing 310 in FIG. 3A) of the electronic device 500 and a second part 502 disposed to correspond to the second housing (for example, the second housing 320 in FIG. 3A) of the electronic device 500 may be proximate while facing each other.

According to an embodiment, the electronic device 500 may include a first part 501, a second part 502, a first circuit board 560 disposed on the first part 501, a second circuit board 570 disposed on the second part 502, multiple antenna modules, and a flexible circuit board 600 (for example, a foldable flexible RF cable (FRC)). The first circuit board 560 may have a modem 566, a transceiver 562, and multiple front end modules 564 disposed thereon. The second circuit board 570 may have an antenna feeder 572 disposed thereon and connected to at least one antenna module. The flexible circuit board 600 may electrically connect the first circuit board 560 on the first part 501 and the second circuit board 570 on the second part 502.

According to an embodiment, the multiple antenna modules may include a first antenna module 510 (a first main antenna module), a second antenna module 515 (a second main antenna module), a third antenna module 520 (a first sub-antenna module), a fourth antenna module 525 (for example, a second sub-antenna module), a fifth antenna module 530 (for example, a third sub-antenna module), a sixth antenna module 535 (for example, a fourth sub-antenna module), a seventh antenna module 540 (for example, a fifth sub-antenna module), an eighth antenna module 545 (for example, a sixth sub-antenna module), a first Wi-Fi antenna module 550, and a second Wi-Fi antenna module 555.

According to an embodiment, Wi-Fi modules are Wi-Fi circuits supporting Wi-Fi communication, for example, but are not limited thereto, and may include Bluetooth circuits supporting Bluetooth communication, for example.

Figure 6:
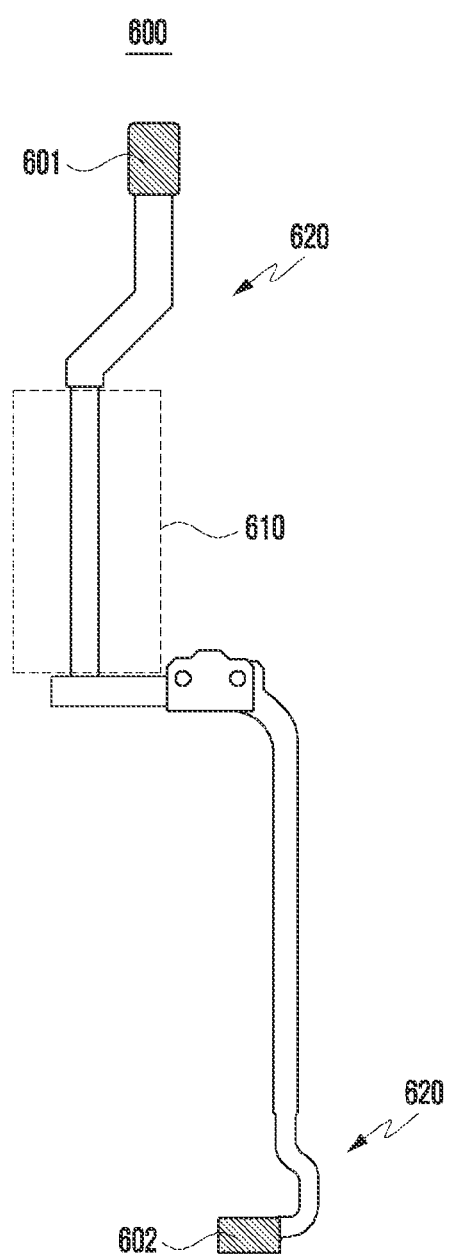
FIG. 6 illustrates a flexible circuit board (for example, a foldable flexible RF cable (FRC)), according to various embodiments.

FIG. 6 illustrates a flexible circuit board 600 (for example, a foldable flexible RF cable (FRC)) according to various embodiments.

In an embodiment and referring to FIG. 5 and FIG. 6, the flexible circuit board 600 (for example, a foldable FRC) may include a first connector 601, a second connector 602, and wire portions 610 and 620. According to an embodiment, the wire portions 610 and 620 may include a first part 610 (for example, a highly-bendable characteristic area) which is bent by folding and unfolding of an electronic device (for example, the electronic device 500 in FIG. 5), and a second part 620 (for example, a slightly-bendable characteristic area) which is not bent thereby. According to an embodiment, the first part 610 (for example, a highly-bendable characteristic area) of the flexible circuit board 600 (for example, a foldable FRC) may be formed so as to correspond to a fold position of the electronic device 500. According to an embodiment, the first part 610 of the flexible circuit board 600 may be disposed between second parts 620 of the flexible circuit board 600.

According to an embodiment, the first part 501 and the second part 502 may approach or abut each other with reference to the fold position when the electronic device 500 is in a folding state. The first part 610 of the flexible circuit board 600 may be disposed on a folded part (for example, fold position) of the electronic device 500 such that the flexible circuit board 600 is not damaged or disconnected at the folded part (for example, fold position) of the electronic device 500. For example, the first part 610 of the flexible circuit board 600 may be disposed so as to at least overlap the hinge module 580.

According to an embodiment, the first part 501 and the second part 502 may be unfolded and spaced apart from each other with reference to the fold position when the electronic device 500 is in an unfolding state. The first part 610 of the flexible circuit board 600 may be disposed on an unfolded part (for example, fold position) of the electronic device 500 such that the flexible circuit board 600 is not damaged or disconnected at the folded and then unfolded part (for example, fold position) of the electronic device 500. That is, the first part 610 of the flexible circuit board 600 may be disposed so as to at least overlap the hinge module 580.

According to an embodiment, the flexible circuit board 600 (for example, a foldable FRC) may be formed to have a thickness of about 50 um to about 70 um. The first part 610 (for example, a highly-bendable characteristic area) and the second part 620 (for example, a slightly-bendable characteristic area) may be formed to have different thicknesses (refer to FIG. 7). According to an embodiment, the first part 610 (for example, a highly-bendable characteristic area) may be formed to have a thickness of about 50 um to about 60 um. According to an embodiment, the second part 620 (for example, a slightly-bendable characteristic area) may be formed to have a thickness of about 70 um.

According to an embodiment, the flexible circuit board 600 (for example, a foldable FRC) may have a first connector 601 formed on one end thereof and connected to the connector 562 of the first circuit board. The flexible circuit board 600 (for example, a foldable FRC) may have a second connector 602 formed on the other end thereof and connected to the connector 564 of the second circuit board. According to an embodiment, the flexible circuit board 600 (for example, a foldable FRC) may electrically connect the first circuit board 560 disposed on the first part 501 and the second circuit board 570 disposed on the second part 502. For example, the flexible circuit board 600 (for example, a foldable FRC) may enable transmission/reception of control signals and RF signals between an electric component disposed on the first part 501 and another electric part disposed on the second part 502.

Figure 7:
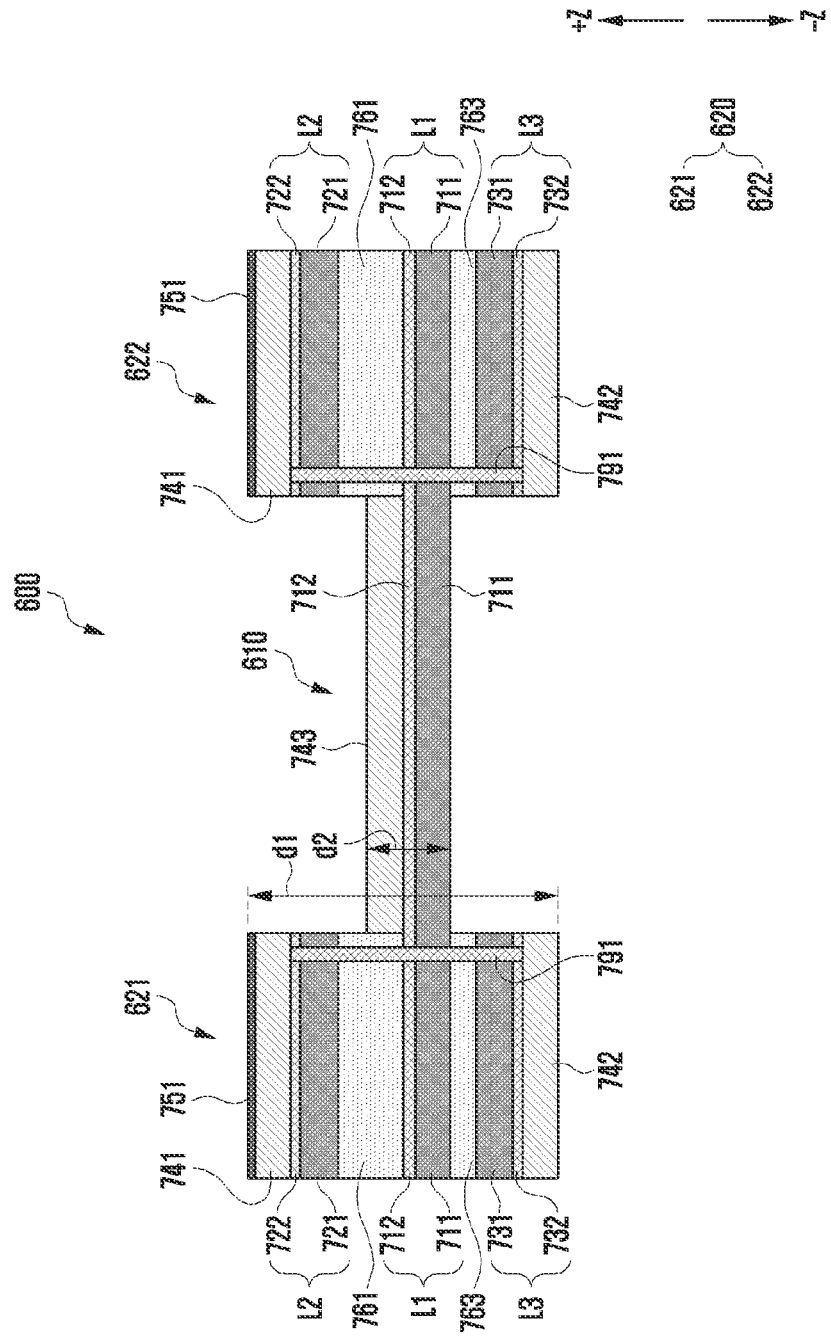
FIG. 7 is a schematic sectional view of a flexible circuit board, according to various embodiments.

FIG. 7 is a schematic sectional view of a flexible circuit board 600 according to various embodiments.

The flexible circuit board 600 illustrated in FIG. 7 may include an embodiment substantially identical to or different from the flexible circuit board 600 illustrated in FIG. 5 and FIG. 6.

In an embodiment and referring to FIG. 7, the flexible circuit board 600 may include a first part 610 having a relatively high degree of bending characteristics and a second part 620 having a relatively low degree of bending characteristics. For example, the first part 610 of the flexible circuit board 600 may have a high degree of bending characteristics compared with the second part 620 of the flexible circuit board 600.

According to an embodiment, the second part 620 may include a first multilayer area 621 disposed to be connected to a first connector (for example, the first connector 601 in FIG. 6) disposed on one end of the flexible circuit board 600, and a second multilayer area 622 connected to a second connector (for example, the second connector 602 in FIG. 6) disposed on the other end of the flexible circuit board 600.

According to an embodiment, the lamination structure of the second part 620 may include a multilayer structure obtained by laminating multiple insulating layers, multiple copper clad layers, and multiple copper plating layers. According to an embodiment, the lamination structure of the first multilayer area 621 may include a multilayer structure obtained by laminating multiple insulating layers, multiple copper clad layers, and multiple copper plating layers. According to an embodiment, the lamination structure of the second multilayer area 622 may be substantially identical to the lamination structure of the first multilayer area 621. In another embodiment, the lamination structure of the second multilayer area 622 may be different from the lamination structure of the first multilayer area 621, and may include, for example, a larger number of insulating layers, copper clad layers, and copper plating layers than the first multilayer area 621. For example, the first multilayer area 621 may include a larger number of insulating layers, copper clad layers, and copper plating layers than the second multilayer area 622.

According to an embodiment, the lamination structure of the second part 620 may include a structure in which multiple copper clad laminates (CCLs) (or flexible copper clad laminates (FCCLs) are laminated, and may include a single-surface CCL structure in which each CCL is formed only in one direction of a specific insulating layer. For example, each of CCLs disposed to correspond to the second part 620 may include an insulating layer, a copper clad layer formed only in a first direction (+z direction) from the insulating layer, and no copper clad layer formed in a second direction (−z direction) from the insulating layer. As used herein, second direction (−z direction) may be defined as opposite to the first direction (+z direction). According to various embodiments, the flexible circuit board 600 may include a single-surface CCL structure so as to improve the flexibility of the flexible circuit board 600.

According to an embodiment, the first multilayer area 621 may include a structure in which multiple CCLs are laminated. According to an embodiment, the lamination structure of the first multilayer area 621 may include a structure in which three CCLs are laminated. According to various embodiments, the number of layers having CCLs laminated in the first multilayer area 621 may be variously modified. According to an embodiment, the first multilayer may include a first layer L1 including a first CCL, a second layer L2 which is formed in the first direction (+z direction) from the first layer L1, and which includes a second CCL, and/or a third layer L3 which is formed in the second direction (−z direction) from the first layer L1, and which includes a third CCL.

According to an embodiment, the first layer L1 may include a first insulating layer 711 and a first copper clad layer 712 formed in the first direction (+z direction) from the first insulating layer 711, thereby forming a first CCL.

According to an embodiment, the second layer L2 may include a second insulating layer 721 and a second copper clad layer 722 formed in the first direction (+z direction) from the second insulating layer 721, thereby forming a second CCL.

According to an embodiment, the third layer L3 may include a third insulating layer 731 and a third copper clad layer 732 formed in the second direction (−z direction) from the third insulating layer 731, thereby forming a third CCL.

According to an embodiment, a first dielectric adhesive 761 may be disposed between the first layer L1 and the second layer L2. According to an embodiment, the first dielectric adhesive 761 may include, for example, a prepreg (PPG) and/or a bonding sheet.

According to an embodiment, a second dielectric adhesive 763 may be disposed between the first layer L1 and the third layer L3. According to an embodiment, the material of the second dielectric adhesive 763 may be substantially identical to the material of the first dielectric adhesive 761.

According to an embodiment, a first coverlay 741 may be formed as a dielectric material in the first direction (+z direction) from the first layer L1. According to an embodiment, an electromagnetic interference (EMI) film 751 may be formed in the first direction (+z direction) from the first coverlay 741.

According to an embodiment, a second coverlay 742 may be formed as a dielectric material in the second direction (−z direction) from the third layer L3. According to an embodiment, the first coverlay 741 and the second coverlay 742 may include the same material.

According to an embodiment, in the first multilayer area 621, the first layer L1, the second layer L2, and the third layer L3 may be electrically connected to each other through a via 791 disposed in at least a partial area. According to an embodiment, the flexible circuit board 600 may have at least one via 791 formed in the first multilayer area 621 and the second multilayer area 622, thereby reducing the structural resonance of a signal wire for transmitting RF signals. To this end, at least some vias 791 formed on the flexible circuit board 600 may be electrically connected to the ground.

According to an embodiment, in the first multilayer area 621, the first copper clad layer 712 of the first layer L1 may have at least one signal sire (refer to FIG. 8) formed thereon to transmit RF signal. According to an embodiment, different metal layers, for example, different layers of CCL or EMI film 751, may be formed in the first direction (+z direction) and the second direction (−z direction) from the first layer L1, respectively, thereby improving RF signal performance and shielding performance.

According to various embodiments, the flexible circuit board 600 may not be necessarily configured such that all CCLs laminated on the second part 620 have a single-surface CCL structure. For example, the second part 620 of the flexible circuit board 600 may include a structure in which multiple CCLs are laminated, and at least some of the multiple CCLs may solely include a single-surface CCL structure. In some embodiments, the second part 620 may include a structure in which multiple CCLs are laminated, and only one CCL extending from a CCL disposed on the first part 610 among the multiple CCLs may include a single-surface CCL structure. For example, a first CCL forming the first layer L1 of the flexible circuit board 600 may be disposed to extend from the second part 620 to the first part 610, and the first CCL may include a single-surface CCL structure. For example, on the second part 620 of the flexible circuit board 600, at least one of the remaining CCLs other than the first CCL, for example, the second CCL of the second layer L2 and the third CCL of the third layer L3, may include a double-surface CCL structure. As used herein, the double-surface CCL structure may refer to a structure in which copper clad layers are formed in the first direction (+z direction) and in the second direction (−z direction) from a specific insulating layer, respectively.

According to an embodiment, the lamination structure of the second multilayer area 622 may be substantially identical to the lamination structure of the first multilayer area 621.

According to an embodiment, the first part 610 of the flexible circuit board 600 may be disposed between the first multilayer area 621 and the second multilayer area 622. For example, the first part 610 may be formed to have a smaller thickness than the first multilayer area 621 and the second multilayer area 622. According to an embodiment, the first multilayer area 621 and the second multilayer area 622 may have a first thickness d1, and the first part 610 may have a second thickness d2 smaller than the first thickness d1.

According to an embodiment, the first part 610 of the flexible circuit board 600 may include a single-surface CCLs 711 and 712 extending from the first layer L1 of the first multilayer area 621 to the first layer L1 of the second multilayer area 622. According to an embodiment, the single-surface CCLs 711 and 712 of the first part 610 may be formed on the same layer with the first CCLs 711 and 712 of the first multilayer area 621 and the first CCLs 711 and 712 of the second multilayer area 622, for example. For example, a single-surface CCL disposed on the first part 610 may include a first insulating layer 711 extending from the first insulating layer 711 of the first multilayer area 621, and a first copper clad layer 712 extending from the first copper clad layer 712 of the first multilayer area 621. According to an embodiment, the first insulating layer 711 and the first copper clad layer 712 disposed on the first part 610 may be connected to the first layer L1 of the second multilayer area 622.

According to an embodiment, a third coverlay 743 may be disposed in the first direction (+z direction) from the first copper clad layer 712 formed on the first part 610. According to an embodiment, the third coverlay 743 may include the same material as the first coverlay 741.

Figure 8:
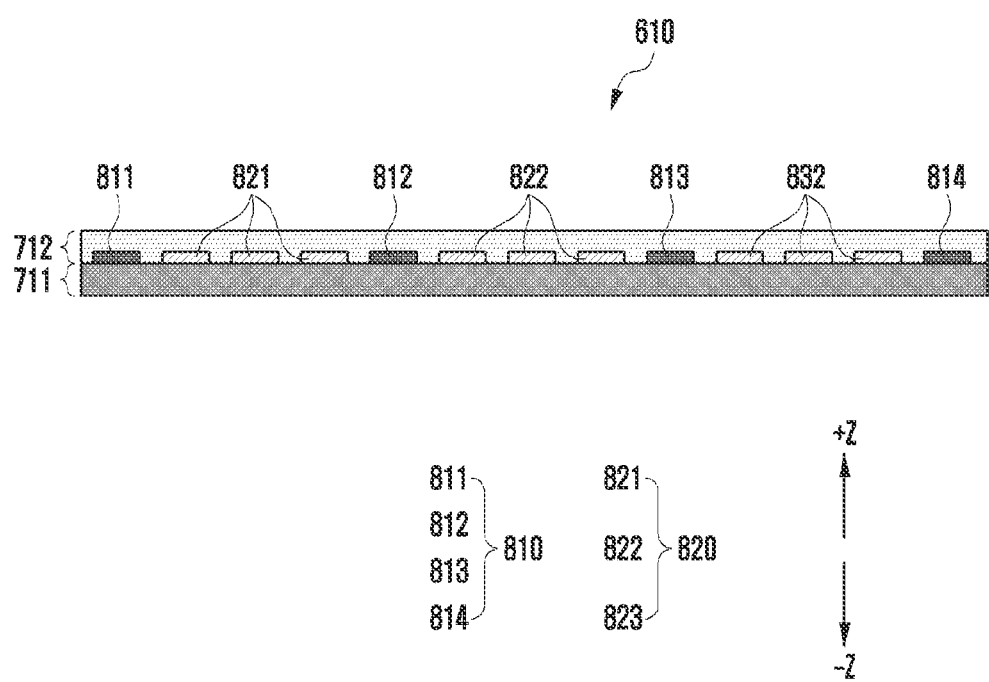
FIG. 8 is a schematic sectional view of a first part of a flexible circuit board, according to various embodiments.

FIG. 8 schematically illustrates an example of the section of a first part 610 of a flexible circuit board 600 according to various embodiments. FIG. 9 is a perspective view of the first part 610 of the flexible circuit board 600 illustrated in FIG. 8, seen from above.

The first part 610 of the flexible circuit board 600 illustrated in FIG. 8 and FIG. 9 may include an embodiment substantially identical to or different from the first part 610 of the flexible circuit board 600 illustrated in FIG. 6 and FIG. 7.

Referring to FIG. 8 and FIG. 9, the first part 610 of the flexible circuit board 600, according to various embodiments, may include multiple signal wires 820 for transmitting RF signals or power signals.

According to an embodiment, the first part 610 of the flexible circuit board 600 may include a first signal wire 821 for transmitting a first RF signal. According to an embodiment, the first signal wire 821 may transfer an RF signal input through the first connector (for example, the first connector 601 in FIG. 6) of the flexible circuit board 600 to the second connector (for example, the second connector 602 in FIG. 6) thereof. Alternatively, the first signal wire 821 may transfer an RF signal input through the second connector 602 to the first connector 601. According to an embodiment, the first signal wire 821 may branch off into multiple sub-wires 911 on the first part 610 of the flexible circuit board 600, thereby transferring RF signal. For example, the first signal wire 821 may include three sub-wires 911 disposed at an interval on the first part 610 of the flexible circuit board 600, and a connecting wire 912 electrically connecting the three sub-wires 911 at one end and the other end of the three sub-wires 911, respectively. According to various embodiments, the connecting wire 912 may be disposed on the first part 610 of the flexible circuit board or disposed on the second part 620 of the flexible circuit board.

According to various embodiments, the number of sub-wires 911 is not limited (three is only an example) as long as multiple sub-wires 911 are provided.

According to an embodiment, the first part 610 of the flexible circuit board 600 may further include multiple signal wires in addition to the first signal wire 821. For example, the first part 610 of the flexible circuit board 600 may further include a second signal wire 822 for transmitting a second RF signal and/or a third signal wire 823 for transmitting a third RF signal. In some embodiments, the first part 610 of the flexible circuit board 600 may further include at least one signal wire (not illustrated) for transmitting a power signal and a control signal in addition to the first signal wire 821, the second signal wire 822, and the third signal wire 823.

According to an embodiment, the second signal wire 822 and the third signal wire 823 may include substantially the same structure as the first signal wire 821. For example, each of the second signal wire 822 and the third signal wire 823 may include multiple sub-wires (not illustrated) and a connecting wire (not illustrated) electrically connecting the multiple sub-wires at one end and the other end of the multiple sub-wires, respectively, similarly to the first signal wire 821.

According to an embodiment, the first part 610 of the flexible circuit board 600 may include a ground wire 810 disposed between signal wires disposed adjacent to each other. According to an embodiment, the ground wire 810 may include a first ground wire 811 disposed on one side (for example, leftward direction) of the first signal wire 821, a second ground wire 812 disposed between the first signal wire 821 and the second signal wire 822, a third ground wire 813 disposed between the second signal wire 822 and the third signal wire 823, and/or a fourth ground wire 814 disposed on the other side (for example, rightward direction) of the third signal wire 823.

According to an embodiment, the ground wire 810 and the signal wires 820 formed on the first part 610 of the flexible circuit board 600 may be formed on the same layer. For example, the ground wire 810 and the signal wires 820 formed on the first part 610 of the flexible circuit board 600 may be formed by a first copper clad layer 712 formed in the first direction (+z direction) from the first insulating layer 711.

According to an embodiment, each of the first signal wire 821, the second signal wire 822, and the third signal wire 823 disposed on the first part 610 of the flexible circuit board 600 may be designed to have about 50Ω (ohm) impedance matching.

According to an embodiment, the flexible circuit board 600 may have a single signal wire branching off into multiple sub-wires 911, thereby reducing the overall wire width during the about 50Ω (ohm) impedance matching. For example, when a signal wire branches off into multiple sub-wires 911, the impedance of a single branching sub-wire 911 may be determined as in Equation 1 below. For example, right terms in Equation 1 may increase in proportion to the number of branching sub-wires 911.

$$1/Z_{Total} = 1/Z_{1-1} + 1/Z_{1-2} + 1/Z_{1-3} \qquad \text{(Equation 1)}$$

According to various embodiments, the flexible circuit board 600 may be configured such that each of signal wires 820 configured to transmit a single RF signal branches off into multiple sub-wires 911 so as to transmit the same, thereby reducing the overall wire width for transmitting the single RF signal. For example, a single signal wire having about 50Ω impedance matching may have a width of about 500 um, while a signal wire which has about 50Ω impedance matching, and which branches off into three sub-wires 911 so as to transmit a single RF signal, may be designed for each about 50 um per sub-wire 911.

According to various embodiments, the flexible circuit board 600 may be advantageous for compact design because the overall width is reduced.

According to various embodiments, the flexible circuit board 600 may have a reduced overall wire width such that, if another metal material approaches the outside thereof, capacitance interference is reduced, thereby reducing the influence of electromagnetic noise.

Figure 10:
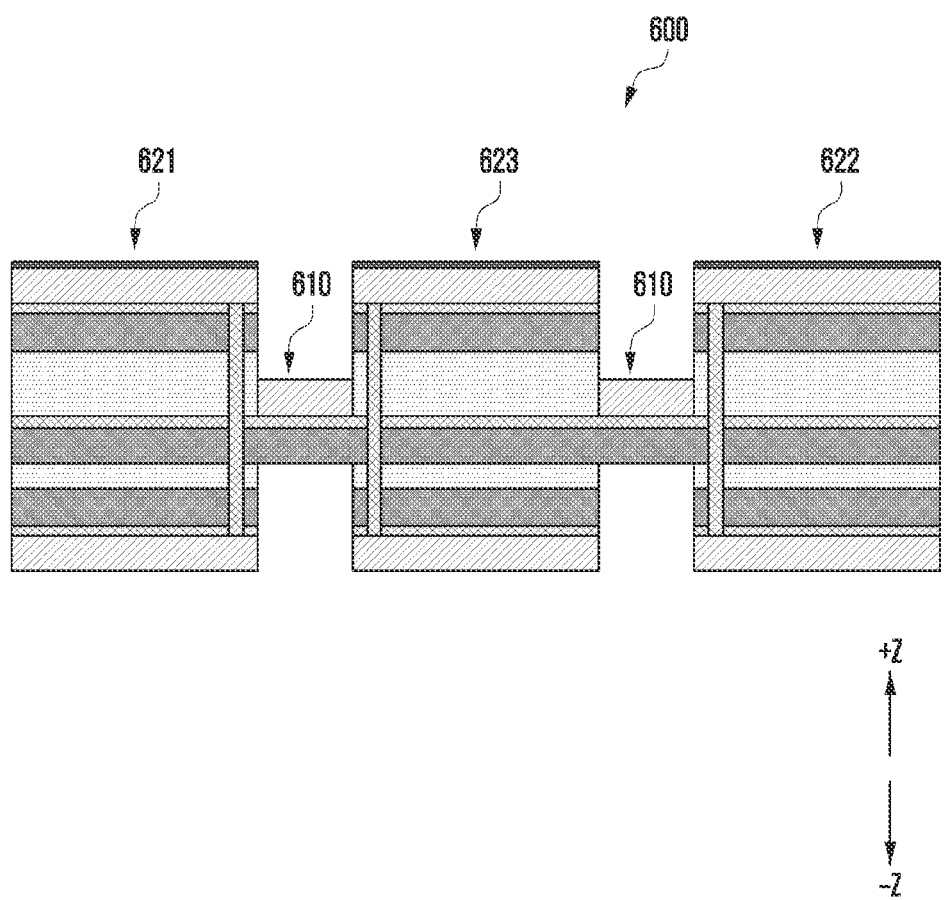
FIG. 10 is a schematic sectional view of a flexible circuit board, according to another embodiment.
Figure 11:
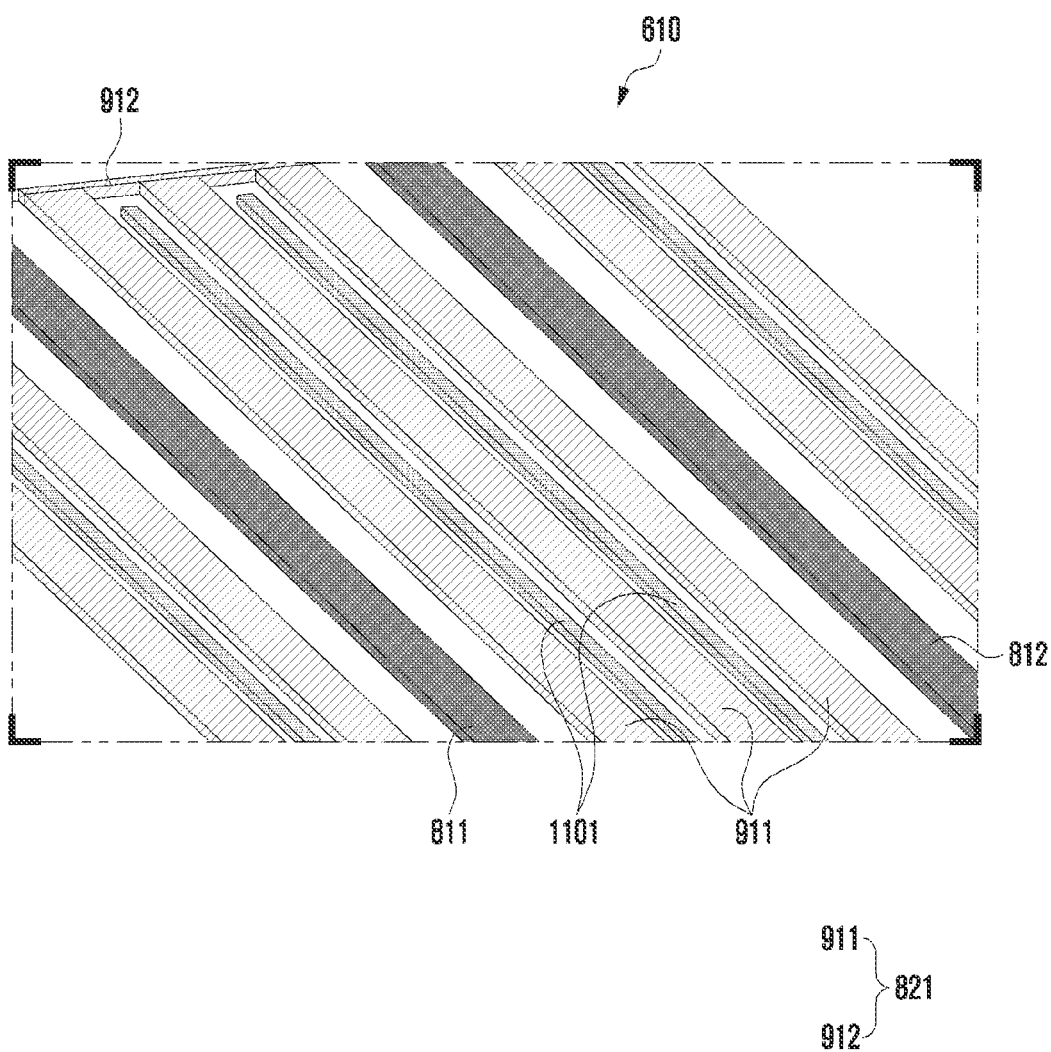
FIG. 11 is a perspective view of a flexible circuit board, according to another embodiment, which has a sub-ground wire formed on a first part of the flexible circuit board.
Figure 12:
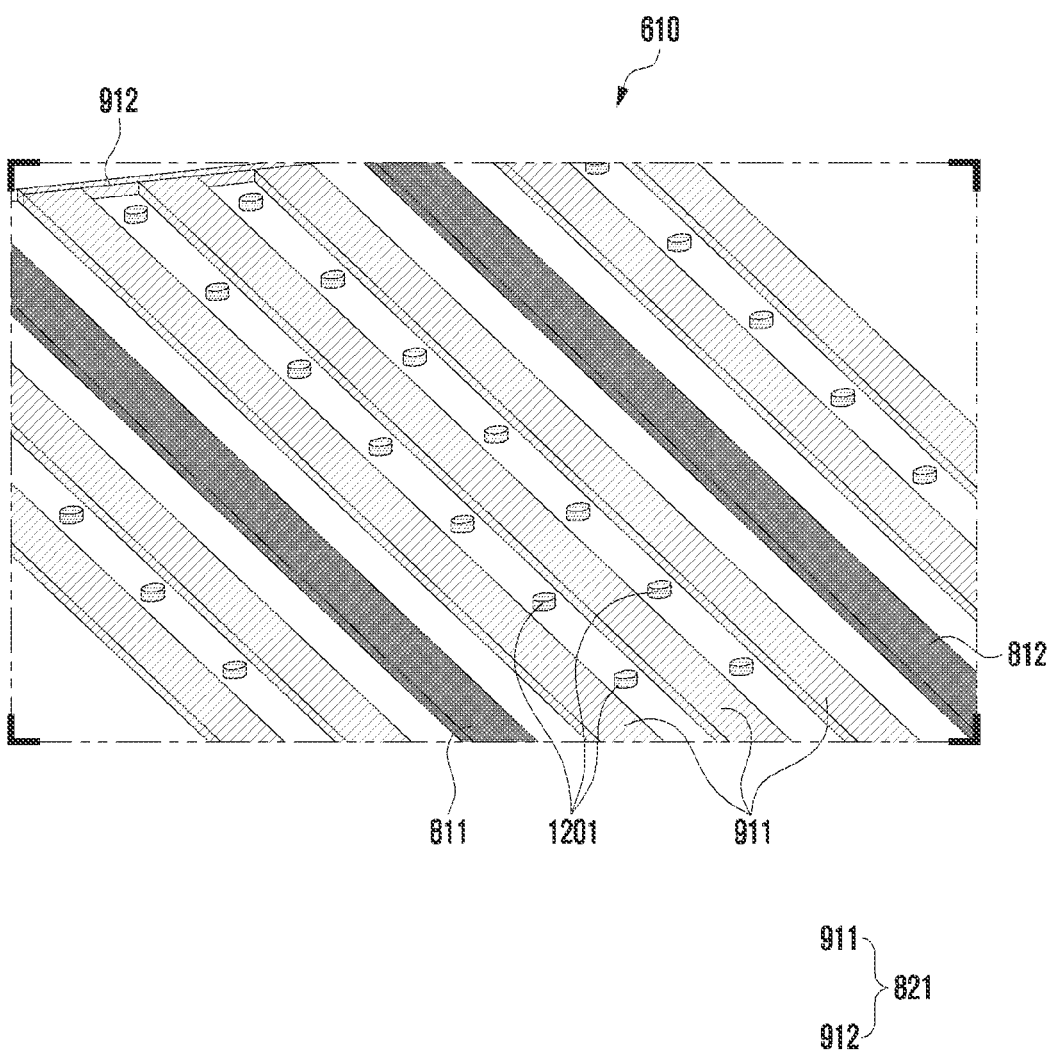
FIG. 12 is a perspective view of a flexible circuit board, according to another embodiment, which has a ground via formed on a first part of the flexible circuit board.

FIG. 10 is a schematic sectional view of a flexible circuit board 600 according to another embodiment. FIG. 11 is a perspective view of a flexible circuit board 600 according to another embodiment, which has a sub-ground wire formed on the first part 610 of the flexible circuit board 600. FIG. 12 is a perspective view of a flexible circuit board 600 according to another embodiment, which has a ground via formed on the first part 610 of the flexible circuit board 600.

The flexible circuit board 600 illustrated in FIG. 10 to FIG. 12 may include an embodiment at least partially similar to or different from the flexible circuit board 600 illustrated in FIG. 5 to and FIG. 9. Hereinafter, different embodiments will solely be described with reference to FIG. 10 to FIG. 12.

Referring to FIG. 10, a flexible circuit board 600 according to another embodiment may not only have a first part 610 of the flexible circuit board 600 disposed between a first multilayer area 621 and a second multilayer area 622, but also have a third multilayer area 623 additionally formed therebetween.

In another embodiment, the lamination structure of the third multilayer area 623 may be substantially identical to the lamination structure of the first multilayer area 621 or the lamination structure of the second multilayer area 622. For example, the lamination structure of the third multilayer area 623 may include a structure in which multiple CCLs are limited, similarly to the lamination structure of the first multilayer area 621, and the multiple CCLs may include a single-surface CCL structure.

In another embodiment, the third multilayer area 623 may be disposed between the first multilayer area 621 and the second multilayer area 622, thereby further reinforcing ground design around signal wires disposed on the first part 610. For example, as illustrated in FIG. 11, the first part 610 of the flexible circuit board 600 may have a third multilayer area 623 disposed such that a sub-ground wire (for example, the sub-ground wire 1101 in FIG. 11) are formed between multiple sub-wires 911 as well. For example, as illustrated in FIG. 12, the first part 610 of the flexible circuit board 600 may have a third multilayer area 623 disposed such that multiple ground vias (for example, the ground vias 1201 in FIG. 12 are formed between multiple sub-wires 911 as well. The multiple ground vias 1201 may be disposed at an interval.

Referring to FIG. 11, the flexible circuit board 600 according to various embodiments may have a sub-ground wire (for example, the sub-ground wire 1101 in FIG. 11) formed between multiple sub-wires 911 as well.

Referring to FIG. 12, the flexible circuit board 600 according to various embodiments may have a ground via (for example, the ground via 1201 in FIG. 12) formed between multiple sub-wires 911 as well, thereby reducing structural resonance of multiple sub-wires 911 for transmitting RF signals.

Figure 13:
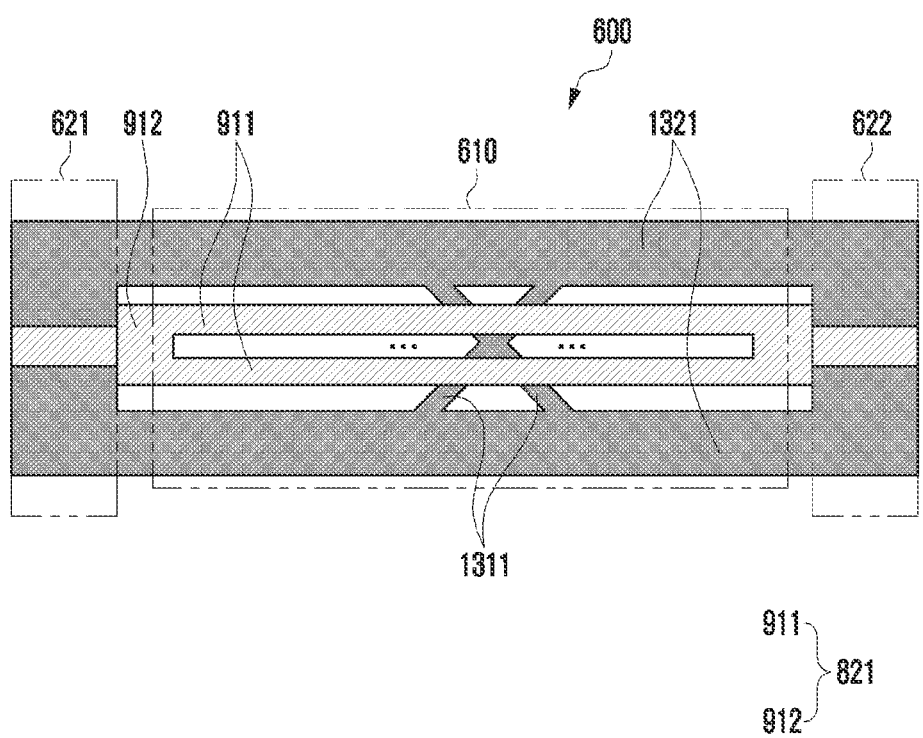
FIG. 13 is a schematic planar view of a flexible circuit board, according to various embodiments.
Figure 14:
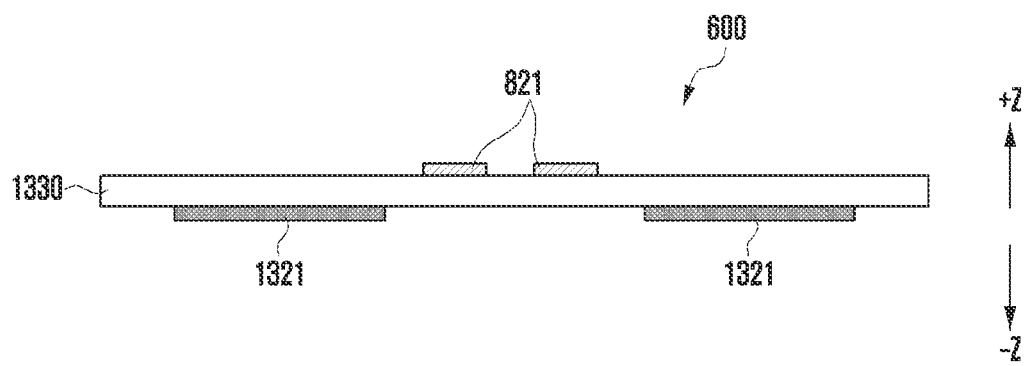
FIG. 14 is a schematic sectional view of the flexible circuit board illustrated in FIG. 13, according to various embodiments.

FIG. 13 is a schematic planar view of a flexible circuit board according to various embodiments. FIG. 14 is a schematic sectional view of the flexible circuit board illustrated in FIG. 13.

The flexible circuit board 600 illustrated in FIG. 13 and FIG. 14 may include an embodiment at least partially similar to or different from the flexible circuit board 600 illustrated in FIG. 5 to and FIG. 12. Hereinafter, different embodiments will solely be described with reference to FIG. 13 and FIG. 14.

Referring to FIG. 13 and FIG. 14, the lamination structure of the first part 610 (for example, a highly-bendable characteristic area) of the flexible circuit board 600 according to various embodiments may include a structure in which multiple copper clad laminates (CCLs) or flexible copper clad laminates (FCCLs) are laminated.

According to various embodiments, the lamination structure of the first part 610 of the flexible circuit board 600 may have each CCL formed in at least one direction from among the upward direction and downward direction of a specific insulating layer. According to an embodiment, a CCL disposed on the first part 610 may include a double-surface CCL structure in which the same is disposed in each of the first direction (+z direction) and the second direction (−z direction) from a specific insulating layer. According to another embodiment, a CCL disposed on the first part 610 may include a single-surface CCL structure in which the same is disposed in only one of the first direction (+z direction) and the second direction (−z direction) from a specific insulating layer.

According to various embodiments, the first part 610 of the flexible circuit board 600 may have, as a double-surface CCL structure, a signal wire 821 (for example, the first signal wire 821 in FIG. 9) formed in the first direction (+z direction) from a specific insulating layer and may have ground patterns 1321 formed in the second direction (−z direction) from the specific insulating layer so as to correspond to both sides of the signal wire 821. According to an embodiment, the ground patterns 1321 may be formed on a different layer from the signal wire 821 and disposed on both sides of the signal wire 821 along the direction in which the signal wire 821 extends.

According to various embodiments, the first part 610 of the flexible circuit board 600 may further include at least one ground bridge 1311 disposed across at least a part of the signal wire 821 such that the ground patterns 1321 formed on both sides of the signal wire 821 are connected to each other. According to various embodiments, the ground bridge 1311 may have a cross shape. According to various embodiments, multiple ground bridges 1311 may be disposed at an interval along the direction in which the signal wire 821 extends. According to various embodiments, multiple ground bridges 1311 may be disposed at an interval in a cross shape so as to overlap at least a part of the signal wire 821 in a mesh shape.

Accordingly, the scope of the various embodiments of the disclosure should be interpreted to include, in addition to the embodiments disclosed herein, all alterations or modifications derived from the technical ideas of the various embodiments of the disclosure. Moreover, the embodiment or parts of the embodiments may be combined in whole or in part without departing from the scope of the disclosure.

The invention claimed is:
1. An electronic device comprising:
   a first housing;
   a second housing;

a hinge module disposed between the first housing and the second housing such that the second housing can fold from one end of the first housing; and a flexible circuit board electrically connecting a first electric component disposed in a first space of the first housing and a second electric component disposed in a second space of the second housing, wherein the flexible circuit board comprises:

a first multilayer area disposed to be connected to a first connector disposed on one side end of the flexible circuit board;

a second multilayer area disposed to be connected to a second connector disposed on the other side end of the flexible circuit board; and a highly-bendable characteristic area disposed between the first multilayer area and the second multilayer area, wherein the first multilayer area and the second multilayer area comprise a lamination structure in which multiple Copper Clad Laminates (CCLs) are laminated, wherein the highly-bendable characteristic area comprises a structure in which a single CCL extends from one of the multiple CCLs, and wherein the single CCL is disposed in the highly-bendable characteristic area and comprises:

a first ground wire;

a second ground wire; and a signal wire configured to transfer one radio frequency (RF) signal, wherein the signal wire is split into a plurality of sub-wires arranged between the first and second ground wires, the plurality of sub-wires being spaced apart from each other and electrically connected at one side via a connecting line.

2. The electronic device of claim 1, wherein the lamination structure comprises:

a first CCL extending from the single CCL;

a second CCL formed in a first direction from the first CCL; and a third CCL formed in a second direction from the first CCL.

3. The electronic device of claim 2, wherein at least one of the first CCL, the second CCL, and the third CCL is formed as a single-surface CCL.

4. The electronic device of claim 2, wherein the first CCL is formed as a single-surface CCL.

5. The electronic device of claim 1, wherein the multiple sub-wires comprise three sub-wires, wherein one of the three sub-wires has an impedance determined by $1/Z_{Total}=1/Z_{1-1}+1/Z_{1-2}+1/Z_{1-3}$.

6. The electronic device of claim 1, further comprising a third multilayer area disposed between the first multilayer area and the second multilayer area, wherein the third multilayer area has a lamination structure identical to the lamination structure of the first multilayer area and the second multilayer area.

7. The electronic device of claim 6, further comprising a plurality of sub-ground wires that are each respectively disposed and interleaved between neighboring ones of the plurality of the sub-wires.

8. The electronic device of claim 6, further comprising a plurality of ground vias that are each respectively disposed and interleaved at an interval between neighboring ones of the plurality of the sub-wires.

9. A flexible circuit board for transmitting a radio frequency (RF) signal of an electronic device, the flexible circuit board comprising:

a first multilayer area connected to a first connector disposed on one side end of the flexible circuit board;

a second multilayer area connected to a second connector disposed on the other side end of the flexible circuit board; and a highly-bendable characteristic area disposed between the first multilayer area and the second multilayer area, wherein the first multilayer area and the second multilayer area comprise a lamination structure in which multiple Copper Clad Laminates (CCLs) are laminated, wherein the highly-bendable characteristic area comprises a structure in which a single CCL extending from one of the multiple CCLs is laminated, and wherein the single CCL comprises:

a first ground wire;

a second ground wire; and a signal wire configured to transfer one RF signal, and wherein the signal wire is split into a plurality of sub-wires arranged between the first and second ground wires, the plurality of sub-wires being spaced apart from each other and electrically connected at one side via a connecting lines.

10. The flexible circuit board of claim 9, wherein the lamination structure comprises:

a first CCL extending from the single CCL;

a second CCL formed in a first direction from the first CCL; and a third CCL formed in a second direction from the first CCL.

11. The flexible circuit board of claim 10, wherein at least one of the first CCL, the second CCL, and the third CCL is formed as a single-surface CCL.

12. The flexible circuit board of claim 10, wherein the first CCL is formed as a single-surface CCL.

13. The flexible circuit board of claim 9, wherein the multiple sub-wires comprise three sub-wires, wherein one of the three sub-wires has an impedance determined by $1/Z_{Total}=1/Z_{1-1}+1/Z_{1-2}+1/Z_{1-3}$.

14. The flexible circuit board of claim 10, further comprising a third multilayer area disposed between the first multilayer area and the second multilayer area, wherein the third multilayer area has a lamination structure identical to the lamination structure of the first multilayer area and the second multilayer area.

15. The flexible circuit board of claim 9, further comprising a plurality of sub-ground wires that are each respectively disposed and interleaved between neighboring ones of the plurality of the sub-wires.

16. The flexible circuit board of claim 9, further comprising a plurality of ground vias that are each respectively disposed and interleaved at an interval between neighboring ones of the plurality of the sub-wires.

* * * * *